(12) United States Patent
Narita

(10) Patent No.: US 12,433,036 B2
(45) Date of Patent: Sep. 30, 2025

(54) SEMICONDUCTOR DEVICE

(71) Applicant: RENESAS ELECTRONICS CORPORATION, Tokyo (JP)

(72) Inventor: Koki Narita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 469 days.

(21) Appl. No.: 17/964,284

(22) Filed: Oct. 12, 2022

(65) Prior Publication Data

US 2023/0135511 A1 May 4, 2023

(30) Foreign Application Priority Data

Oct. 29, 2021 (JP) .................... 2021-177319

(51) Int. Cl.
*H10D 89/60* (2025.01)

(52) U.S. Cl.
CPC ......... *H10D 89/811* (2025.01); *H10D 89/921* (2025.01)

(58) Field of Classification Search
CPC .. H10D 89/811; H10D 89/921; H10D 89/601; H10D 89/611
USPC .......................................................... 361/56
See application file for complete search history.

(56) References Cited

U.S. PATENT DOCUMENTS

| | | | |
|---|---|---|---|
| 11,689,014 B2 * | 6/2023 | Krishnamoorthy | H02H 9/02 361/111 |
| 2008/0030910 A1 * | 2/2008 | Fairgrieve | H03K 17/08142 361/111 |
| 2013/0235496 A1 * | 9/2013 | Lai | H02H 9/046 361/56 |
| 2017/0272072 A1 * | 9/2017 | Okushima | H03K 19/003 |
| 2019/0149144 A1 * | 5/2019 | Zhu | H03K 17/0822 361/86 |

FOREIGN PATENT DOCUMENTS

JP 2009-099641 A 5/2009

\* cited by examiner

*Primary Examiner* — Dharti H Patel
(74) *Attorney, Agent, or Firm* — Rimon P.C.

(57) ABSTRACT

Breakdown of an internal element during an ESD application of a semiconductor device is suppressed. When static electricity is applied to an I/O signal pad, a discharge path is formed by an electrostatic protection mechanism. A gate switch circuit is arranged corresponding to a transistor to be protected having a drain electrically connected to the I/O signal pad. The gate switch circuit electrically connects a gate of the transistor to be protected to a first node having a potential higher than a potential of an I/O GND line when the discharge path is formed at the time of the application of static electricity to the I/O signal pad.

17 Claims, 14 Drawing Sheets

SEMICONDUCTOR DEVICE

CROSS-REFERENCE TO RELATED APPLICATION

This disclosure of Japanese Patent Application No. 2021-177319 filed on Oct. 29, 2021 including the specification, drawings and abstract is incorporated herein by reference in its entirety.

BACKGROUND

The present disclosure relates to a semiconductor device. The present disclosure more particularly relates to a semiconductor device provided with protective functions against ESD (electrostatic discharge).

There are disclosed techniques listed below.
[Patent Document 1] Japanese Unexamined Patent Application Publication No. 2009-99641

Conventionally, in a semiconductor device, an electrostatic protection circuit for protecting the internal circuit from electrostatic discharge to the input and output terminals from the outside is provided. For example, Japanese Unexamined Patent Application Publication No. 2009-99641 (Patent Document 1) discloses a circuit configuration in which an electrostatic protective circuit including MOS (Metal Oxide Semiconductor) transistors is connected between an input/output line connected to an input/output terminal and a power supply line and a ground line.

SUMMARY

As a part of the operation confirmation test of the semiconductor device, an electrostatic breakdown test (hereinafter referred to as "ESD test") to confirm that the above ESD protection function operates normally is executed. In the ESD test, breakdown resistance of the semiconductor device when the electrical stress simulating ESD is applied to an external terminal such as a power supply terminal, a GND terminal, and a signal input/output (I/O) terminal is evaluated.

On the other hand, in recent years, since the miniaturization of the manufacturing process of the semiconductor device has progressed, decrease of the breakdown voltage of the transistor, and, the increase of the wiring parasitic resistance has progressed. During the ESD test, or, during the electrostatic discharge exposure (hereinafter, referred to as "ESD application") in an assembly process of the semiconductor or a mounting process to electronic devices, the current (hereinafter, referred to as "ESD application") flowing from the external terminal to the inside of the semiconductor (hereinafter, referred to as "ESD current") is guided by the operation of the electrostatic protection circuit to other external terminal having a reference potential at the time of the application of the ESD. At this time, when the parasitic wiring resistance of the ESD current path is increased, the amount of voltage drop generated when the ESD current flows is increased. As a result, at the time of the application of the ESD, with respect to the internal element (transistor) connected to the ESD current path, there is a concern that a potential difference exceeding the breakdown voltage is applied.

The present disclosure solves the above-mentioned problems and provides a semiconductor device capable of suppressing breakdown of an internal element during ESD application.

Other problems and novel features will become apparent from the description herein and the accompanying drawings.

According to an embodiment, a semiconductor device comprises a signal pad, a GND pad, a plurality of drive transistors, and an electrostatic protection mechanism. The plurality of drive transistors are electrically connected between the power supply line and the GND line via a signal node electrically connected to the signal pad. The plurality of drive transistors include a transistor to be protected having a drain electrically connected to the signal pad. When an electrical signal (e.g., static electricity) is applied to the signal pad while the GND pad has a reference potential, the electrostatic protection mechanism forms a discharge path from the signal pad to the GND pad. The electrostatic protection mechanism includes a gate switch circuit. The gate switch circuit controls the electrical connection destination of the gate of the transistor to be protected upon application of an electrical signal. The gate switch circuit, at the time of the application of an electric signal (static electricity), electrically connects the gate to a first node whose potential becomes higher than the GND line at the time of the formation of the discharge path.

According to an embodiment, it is possible to suppress the breakdown of the internal element at the time of the application of the ESD.

BRIEF DESCRIPTIONS OF THE DRAWINGS

DETAILED DESCRIPTION

Figure 1:
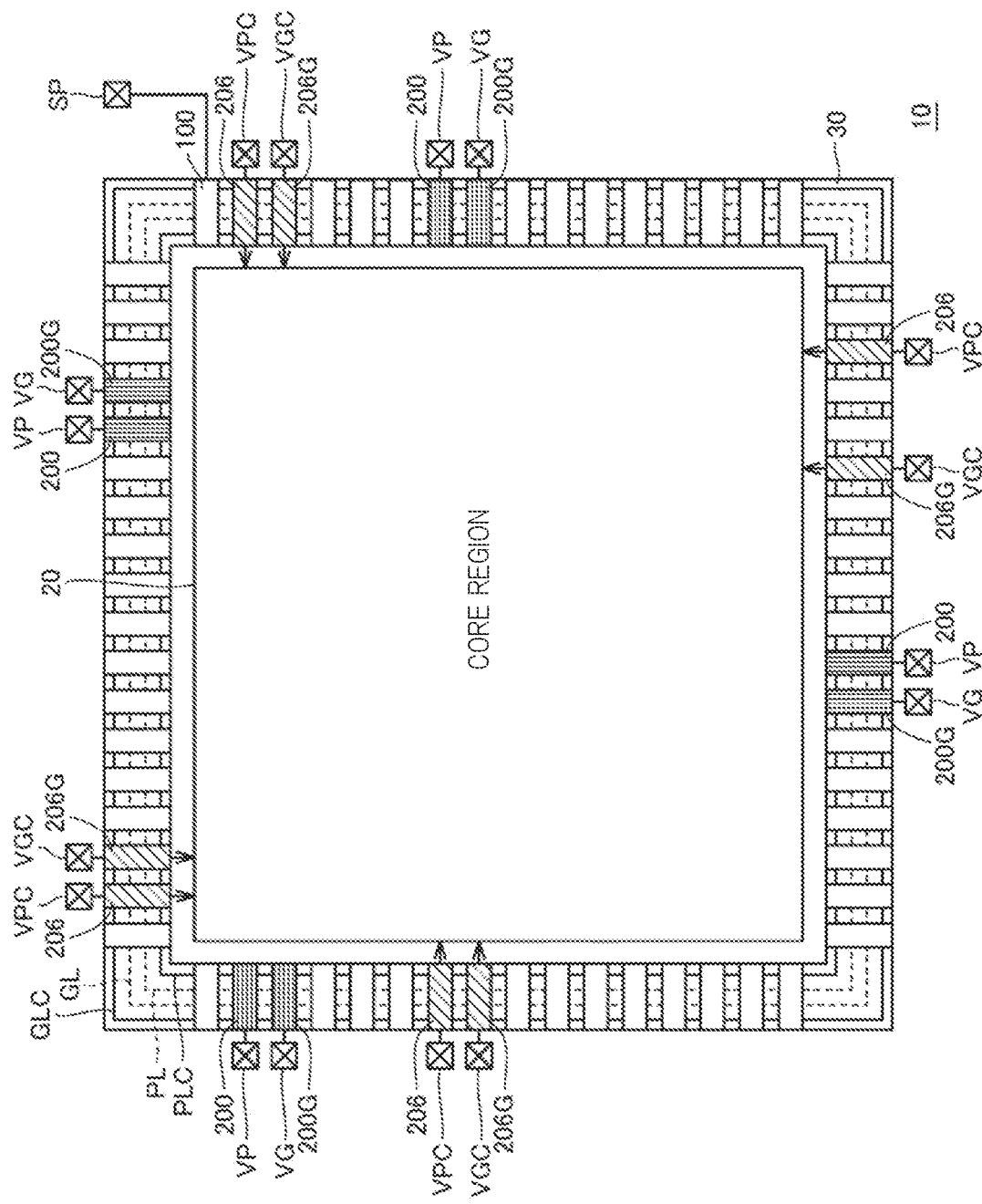
FIG. 1 is a schematic diagram for explaining the overall configuration of a semiconductor device according to the present embodiment.

Hereinafter, embodiments of the present disclosure will be described in detail with reference to the accompanying drawings. In the specification and drawings, the same or corresponding components are denoted by the same reference numerals, and a repetitive description thereof is not repeated. In the drawings, for convenience of description, the configuration may be omitted or simplified.

First Embodiment

As illustrated in FIG. 1, a semiconductor device 10 according to the present embodiment includes a core region 20, and an I/O region 30 arranged in the outer peripheral region. In the core region 20, for example, core logic, analogue circuit, and the like configured as an ASIC (application specific integrated circuit having a predetermined function are arranged. In FIG. 1, the I/O region 30 is arranged over the entire outer periphery, and although the core region 20 is arranged on the inner peripheral side of the I/O region 30, it is also possible to include a portion of the outer peripheral region in the core region 20.

The I/O region 30 includes an I/O cell 100 serving as an input/output interface of the signal, a power supply cell 200 for an I/O power supply, a power supply cell 200G for an I/OGND, a power supply cell 206 for a core power supply, and a power supply cell 206G for a core GND. The I/O cell 100 is electrically connected to a pad SP for signal input and output. The power supply cell 200 is electrically connected to a pad VP for the I/O power supply and the power supply cell 200G is electrically connected to a pad VG for the I/OGND. In addition, the power cell 206 is electrically connected to the pad VPC for the core power supply, and the power cell 206G is electrically connected to a pad VGC for the core GND.

The I/O power supply voltage input to the pad VP is transmitted to a power supply line PL via the power supply cell 200. The ground voltage (GND) for I/O input to the pad VP is transmitted to a GND line GL via the power supply cell 200G. The core power supply voltage input to the pad VPC is transmitted to a power supply line PLC via the power supply cell 206. The ground voltage for cores (GND) input to the pad VGC is transmitted to the GND line GLC via the power supply cell 206G.

The power supply lines PLC, PL, and, GND lines GLC, GL are arranged in the outer peripheral region, and supply the power supply voltage and the ground voltage (GND) to the respective circuit inside the semiconductor device 10. The power supply voltage and GND for the core is supplied to the core region 20. On the other hand, the power supply voltage and ground voltage (GND) for I/O is not supplied to the core region 20.

Incidentally, the semiconductor device 10 may be input a plurality of power supply voltages of different voltage levels. In this case, the power supply lines PL, PLC are provided as a plurality of lines which are electrically connected to the different pads VP, VPC respectively. For example, the pads and power supply lines of the I/O cell dedicated power supply and the pads and power cells of the power supplied to the core region are provided as different ones. Further, a portion of the electrostatic protection circuit, which will be described later, is arranged in the power supply cell 200. Further, from the viewpoint of noise propagation prevention, the GND pad VG and GND line GL for supplying a ground voltage (GND) to the power supply (I/O) cell 200, and the GND pad VGC and GND line GLC for supplying a ground voltage (GND) to the core region 20 may be electrically separated.

During the ESD test of the semiconductor device 10, one of the pad VG for the I/OGND, the pad VP for the I/O power supply, the pad VPC for the core power supply, and the pad VGC for the core GND is grounded as a reference terminal having a reference potential at the time of the test. Furthermore, in this state, from an external test device of the semiconductor device 10, an electric signal simulating an ESD is applied to the pad SP, or the remaining pad not set to the reference terminal of the pad VG for the I/OGND, the pad VP for I/O power supply, the pad VPC for the core power supply, and the pad VGC for core GND is applied, thereby, breakdown resistance of the semiconductor device 10 is evaluated.

As described above, the time when an ESD is applied in the present disclosure includes, in addition to the case where an electrical signal simulating an ESD is intentionally applied to the pad in the ESD test, the case where an unintentional ESD is applied to the pad as an electrical signal in the assembly process of the semiconductor or the mounting process to the electronic devices. By properly actuating the electrostatic protection mechanism described in detail below to the application of such electrical signal generated by static electricity, i.e., ESD application, breakdown of internal elements (typically, transistors) is suppressed.

(Comparative Example of Electrostatic Protection Mechanism)

Next, through the description of the comparative example of the electrostatic protection mechanism, the problem at the time of the application of the ESD in the semiconductor device 10 to which microfabrication process is applied will be described.

Figure 2:
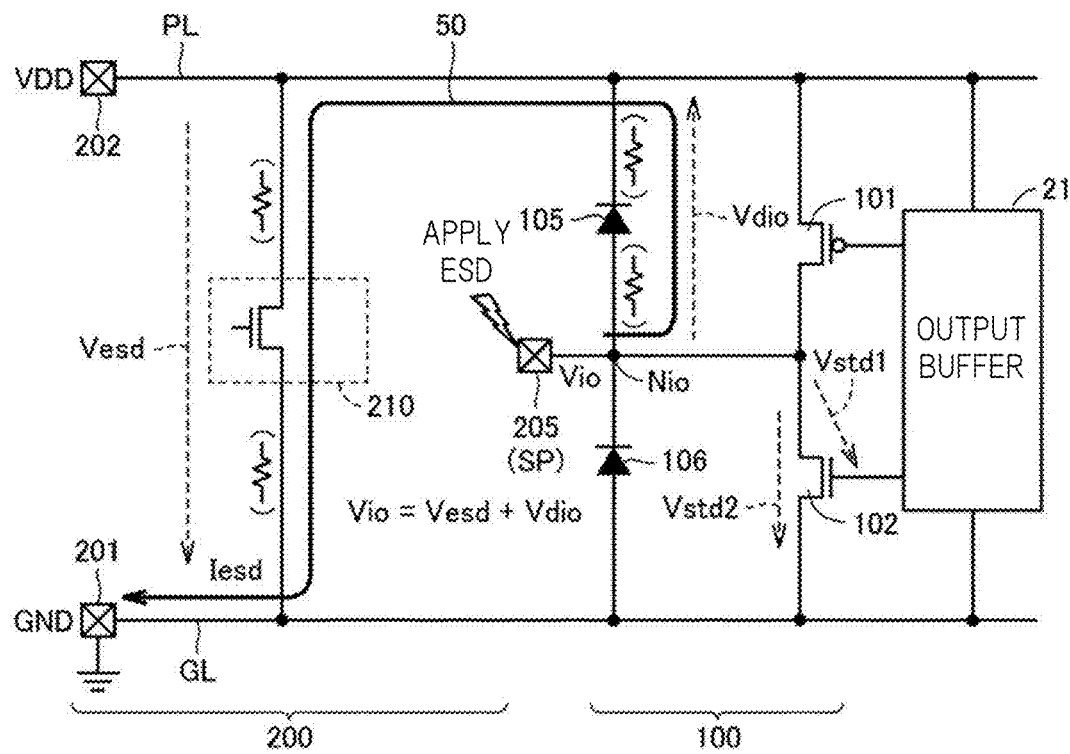
FIG. 2 is a circuit diagram for explaining a problem at the time of the application of the ESD in the electrostatic protection mechanism according to the comparative example.

As illustrated in FIG. 2, the I/O cell 100 of the semiconductor device 10, a P-type transistor 101 and an N-type transistor 102 constituting an output circuit are arranged. The transistor 101 is electrically connected between the power supply line PL and a signal node Nio electrically connected to an I/O signal pad 205. Transistor 102 is electrically connected between the signal node Nio and the GND line GL for the /O (hereinafter, also referred to as I/OGND line GL).

In the present disclosure, the phrase "electrically connected" is not limited to direct connection by wiring, and also includes an electrical connection in which a current path can be formed through other elements (not illustrated) such as a resistive element. For example, in FIG. 2, an electrical connection between the drain and source of the transistor 102 and the signal node Nio and the I/O GND line GL is implemented by directly connecting the source and the drain and the signal node Nio and the I/O GND line GL by wiring is illustrated. However, the drain and the source of the transistor 102, may be connected to the signal node Nio and I/O GND line GL via a resistive element (not illustrated) or the like.

The power supply line PL is electrically connected to a power supply pad 202, and the I/OGND line GL is electrically connected to the GND pad 201. A GND pad 201 and a power supply pad 202 are equivalent to the pad VG for the I/OGND and the pad VP for I/O power supply, respectively, as illustrated in FIG. 1. The I/O signal pad 205 is equivalent to the pad SP illustrated in FIG. 1.

An output signal of the output buffer 21 is input to the gates of the transistors 101 and 102. During operation of the semiconductor device 10, the transistor 101 or 102 is turned on by the output signal of the output buffer 21. Thus, to the I/O signal pad 205, one of the H (high) level voltage (VDD) and the L (low) level voltage (GND) is selectively output.

The electrostatic protection mechanism according to the comparative example is realized by protection diodes 105 and 106 arranged in the I/O cell 100 and the ESD circuit 210 arranged in the power supply cell 200. The protection diode 105 is electrically connected between the signal node Nio and the power supply line PL from the signal node Nio toward the power supply line PL as a forward direction. The protection diode 106 is electrically connected between the signal node Nio and the I/OGND line GL from the I/OGND line GL toward the signal node Nio as a forward direction.

An ESD circuit 210 is arranged between the power supply line PL electrically connected to the power supply pad 201 and the I/OGND line GL. The ESD circuit 210 comprehensively describes any configuration known in the art, but is typically configured to include an N-type transistor that is autonomously turned on in response to the occurrence of an ESD current.

When an ESD is applied to the I/O signal pad 205 while the GND pad 201 for the I/O has a reference potential, the protection diode 105 and the ESD circuit 210 are activated accordingly, and a discharge path 50 of the applied ESD is formed inside the semiconductor device 10. In the discharge path 50, an ESD current Iesd flows through a path of the I/O signal pad 205-protection diode 105-power supply line PL-ESD circuit 210-I/OGND line GL-GND pad 201.

At the time of the application of the ESD, by flowing the ESD current Iesd in the discharge path 50, a potential difference Vdio is generated between the signal node Nio and the power supply line PL, and also a potential difference Vesd is generated between the power supply line PL and the I/OGND line GL.

The potential difference Vdio is indicated by the sum of the forward voltage of the protection diode 105 and the amount of voltage drop generated by the wiring parasitic resistor for electrically connecting the protection diode 105 between the signal node Nio and the power supply line PL.

Similarly, the potential difference Vesd is indicated by the sum of the amount of voltage drop occurring during operation of the ESD circuit 210, and the amount of voltage drop generated by the wiring parasitic resistor for electrically connecting the ESD circuit 210 between the power supply line PL and the I/OGND line GL.

Consequently, at the time of the application of the ESD, a voltage Vio of the signal node Nio is indicated by the sum of the potential difference Vesd and Vdio described above (Vio=Vdio+Vesd). On the other hand, since the source of the transistor 102 is electrically connected to the I/OGND line GL which is electrically connected to the GND pad 201 having a reference potential at the time of the application of the ESD, the potential is 0 [V].

Consequently, at the time of the application of the ESD, a potential difference Vstd2 applied between the drain and the source of the transistor 102 is equal to the voltage Vio of the signal node Nio. Also, as to a potential difference Vsdt1 applied between the gate and the drain of the transistor 102, in case a potential of the gate of the transistor 102 becomes 0 [V] at the time of the application of the ESD, it is equivalent to the voltage Vio of the signal node Nio. On the other hand, in the advanced process where miniaturization progresses, as described above, by the increase of the wiring parasitic resistance in the discharge path 50 formed at the time of the application of the ESD, the voltage Vio is increased, and a breakdown voltage of each transistor also decreases. For these reasons, there is a concern that at the time of the application of the ESD, a potential difference in excess of the breakdown voltage is applied between the gate and the drain and between the drain and the source of the transistor 102.

In order to ensure the breakdown voltage between the drain and source of the transistor 102, it is conceivable to employ a multi-stage vertical stacking configuration in which a plurality of transistors are electrically connected in series.

Figure 3:
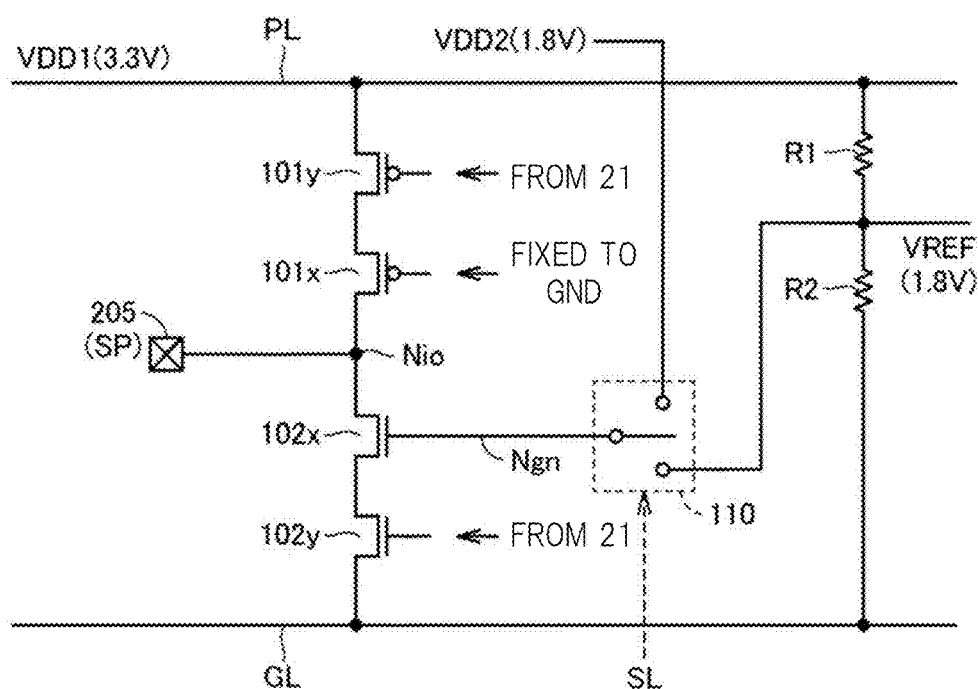
FIG. 3 is a circuit diagram for explaining a multi-stage vertical stacking configuration of the output circuit of the semiconductor device.

In FIG. 3, a circuit diagram explaining a multi-stage vertical stacking configuration of the output circuit of the semiconductor device is illustrated.

As illustrated in FIG. 3, in the output circuit having the multi-stage vertical stacking configuration, a plurality of P-type transistors 101x and 101y are electrically connected in series between the power supply line PL and the signal node Nio. Similarly, a plurality of N-type transistors 102x and 102y are electrically connected in series between the signal node Nio and the I/OGND line GL.

For example, while an operating voltage of each transistor is 1.8 [V], when a power supply voltage VDD1 supplied to the power supply line PL is 3.3 [V], as in the example of FIG. 3, a multi-stage vertical stacking configuration by two transistors can be applied to the output circuit. Thus, it is possible to mitigate the potential difference applied to the transistor one stage to about its operating voltage.

In the output circuit of the multi-stage vertical stacking configuration, a portion of the plurality of transistors electrically connected in series is fixed to the on state, while the on-off of remaining transistors is controlled according to the output signal from the output buffer 21 (FIG. 2). Thus, one of the H level (VDD1) and the L level (GND) can be selectively output from the I/O signal pad 205.

In the example of FIG. 3, the transistors 101x and 102x whose drains are electrically connected to the signal node Nio are fixed on. Therefore, the gate of the transistor 101x needs to be fixedly set to the ground voltage GND, and the gate of the transistor 102x needs to be fixedly set to a power supply voltage VDD2 (1.8 [V]).

Therefore, in order to stably turn on and fix the transistor 102x at the time of the startup of the semiconductor device 10 (at the time of the power-on), the power supply voltage VDD2 needs to be quickly supplied to the gate of the semiconductor device 10. At this time, in order to correspond to the use mode in which the side of the power supply voltage VDD1 is input to the semiconductor device 10 earlier than the power supply voltage VDD2, it is conceivable to generate a power supply voltage VDD2 from the power supply voltage VDD1.

For example, in the example of FIG. 3, a reference voltage VREF corresponding to the power supply voltage VDD2 (1.8 [V]) is generated by dividing the power supply voltage VDD1 (3.3 [V]) by the resistive elements R1 and R2. Further, a gate switch circuit 110 is arranged on the gate of the transistor 102x. The gate switch circuit 110 selectively supplies one of the power supply voltage VDD2 supplied from the outside of the semiconductor device 10 and the reference voltage VREF generated by voltage division to the gate of the transistor 102x in accordance with the control signal SL.

Thus, even in the power supply start sequence in which power supply voltage VDD2 is supplied later than the power supply voltage VDD1, it is possible to stabilize the operation of the output circuit at the time of startup of the semiconductor device 10. That is, the degree of freedom of the power start sequence for the semiconductor device 10 is improved.

Figure 4:
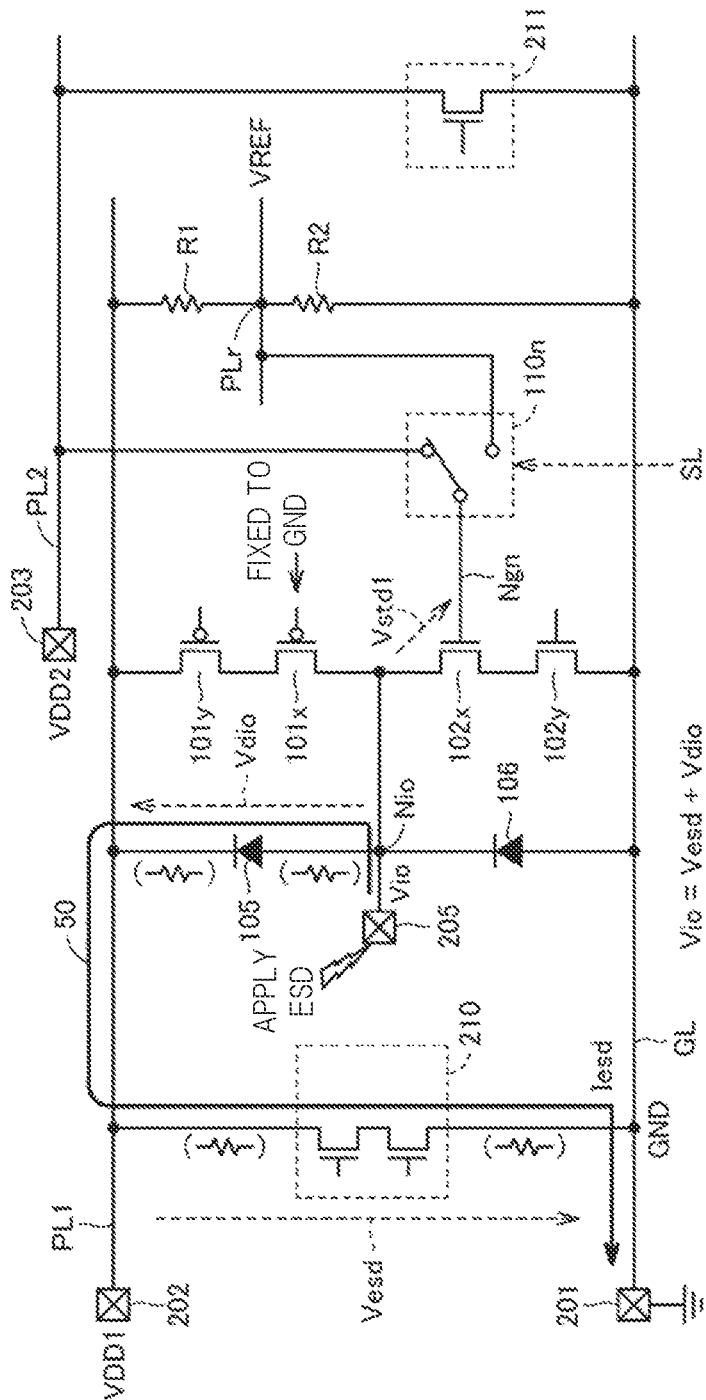
FIG. 4 is a circuit diagram illustrating a problem at the time of the application of the ESD when applying the electrostatic protection mechanism according to the comparative example to the output circuit illustrated in FIG. 3.

FIG. 4 illustrates a circuit diagram for explaining a problem at the time of the application of the ESD when an electrostatic protection mechanism similar to that of FIG. 2 is applied to an output circuit having a multi-stage vertical stacking configuration illustrated in FIG. 3.

In FIG. 4, the power supply voltage VDD1 is supplied by the power supply line PL1, while the power supply voltage VDD2 is supplied by the power supply line PL2. Each of the power supply lines PL1, PL2 is electrically connected to a power supply pad 202 and a power supply pad 203 for I/O, respectively. The power supply pad 202 to which VDD1 is input and the power supply pad 203 to which VDD2 is input are included in the power supply pad SP for I/O in FIG. 1. Further, the reference voltage VREF obtained by dividing the power supply voltage VDD1 by the resistive elements R1, R2 is supplied by a reference voltage line PLr.

As illustrated in FIG. 4, the protection diodes 105, 106 similar to FIG. 2, and the ESD circuit 210 are electrically connected to the power supply line PL1, the signal node Nio, and the I/OGND line GL. Also, in the configuration of FIG. 4, when the GND pad 201 becomes a terminal having a reference potential, and the ESD is applied to the signal pad 205 to generate ESD current, and in the signal node Nio, a voltage Vio (Vio=Vesd+Vdio) same with FIG. 2 is generated. However, as to the ESD circuit 210, similarly to the output circuit, since it is composed of transistors configured by multi-stage vertical stacking, the capability of suppressing the potential difference when the ESD current flows is low, the potential difference Vesd generated in the ESD circuit 210 is larger than the configuration of FIG. 2.

At this time, in the transistor 102x, the potential difference applied between the drain and the source is reduced by half as compared with the transistor 102 in FIG. 2 because the voltage Vio is shared by the transistors 102x and 102y. That is, by making the output circuit a multi-stage vertical stacking configuration, the potential difference applied between the drain and the source of each transistor at the time of the ESD application is alleviated.

If the ESD is applied to the signal pad 205 in a state in which the GND pad 201G for I/O has a reference potential, then the power supply line PL2 will not participate in the ESD discharge path 50 with the ESD application. Therefore, to the power supply line PL2, 0 [V] which is the potential of I/O GND line GL is transmitted via the ESD circuit 211 electrically connected between the power supply line PL2 and the I/O GND line GL. Accordingly, when the gate switch circuit 110 electrically connects the gate of the transistor 102x to the power supply line PL2 during the ESD application, there is a concern that a potential difference corresponding to the voltage Vio of the signal node Nio is applied between the drain and the gate of the transistor 102x. Thus, even if the output circuit is a multi-stage vertical stack configuration, in a transistor having a drain that is electrically connected to the I/O signal pad 205, a potential difference applied between the drain and the gate at the time of the application of the ESD is not mitigated. That is, it is understood that the application of the microfabrication process increases the risk of breakdown of a gate oxide film of the transistor 102x in the semiconductor device 10.

(Description of Electrostatic Protection Mechanism According to the First Embodiment)

Figure 5:
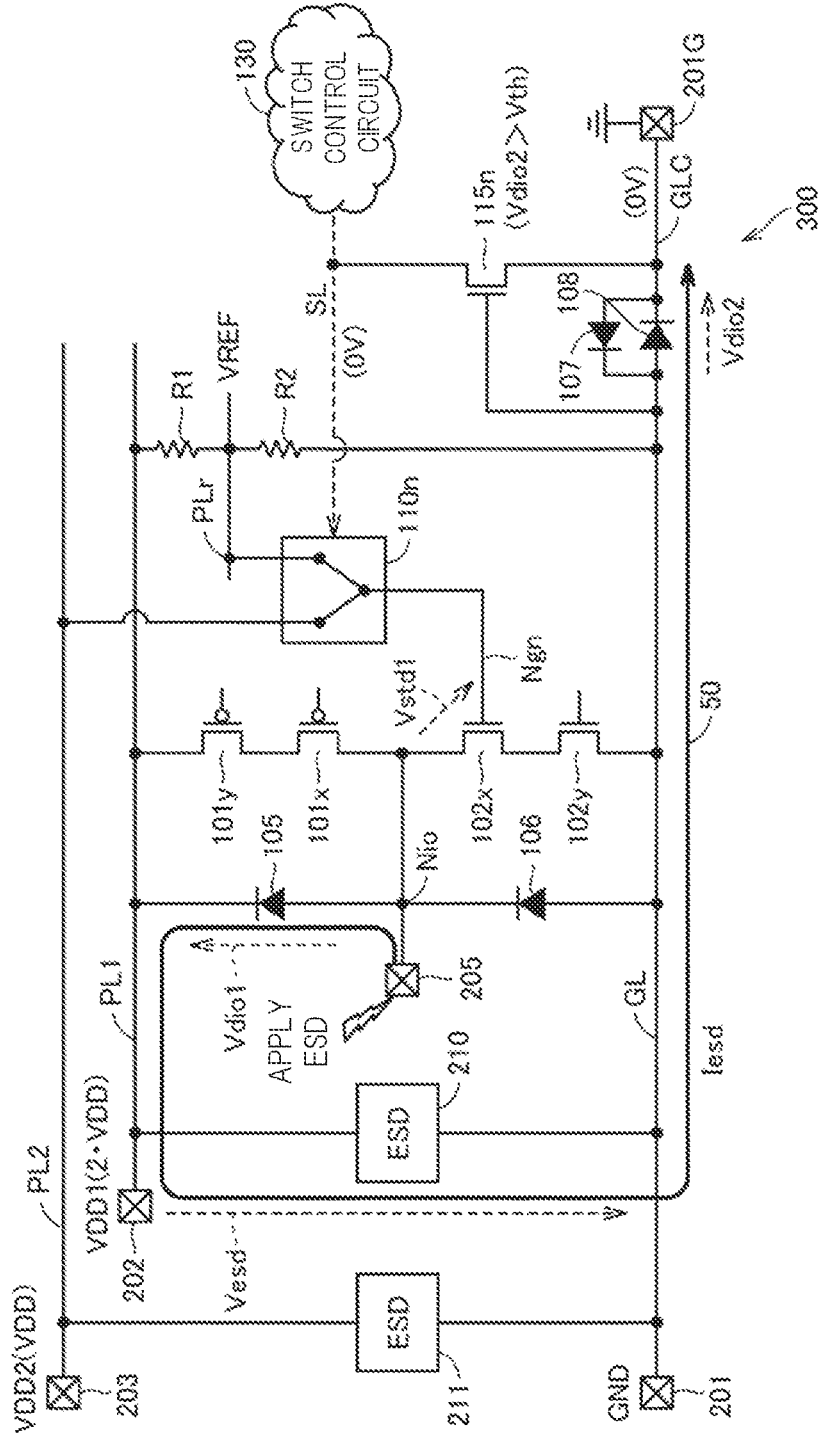
FIG. 5 is a circuit diagram illustrating an electrostatic protection mechanism of the semiconductor device according to the first embodiment.

As illustrated in FIG. 5, the output circuit of the semiconductor device 10 according to the first embodiment is configured similarly to FIG. 4, and includes P-type transistors 101x and 101y and N-type transistors 102x and 102y. That is, the transistors 101x, 101y, 102x, and 102y between the power supply line PL1 and the I/OGND line GL are electrically connected in series via the signal node Nio, and this configuration corresponds to an embodiment of the "plurality of drive transistors".

In particular, the P-type transistors 101x and 101y correspond to "a plurality of first transistors", and the N-type transistors 102x and 102y correspond to "a plurality of second transistors". Among the transistors 101x, 101y, 102x, and 102y, the transistors 101x and 102x having drains connected to the signal node Nio correspond to an embodiment of the "transistor to be protected". In particular, the transistor 101x corresponds to the "first transistor to be protected" and the transistor 102x corresponds to the "second protection target transistor".

The semiconductor device 10 according to the first embodiment includes a GND pad 201 for I/O, a GND pad 201G for a core (hereinafter, simply referred to as "core GND pad 201G"), a power supply pad 202 to be supplied with a power supply voltage VDD1, and a power supply pad 203 to be supplied with a power supply voltage VDD2. The supply voltage VDD2 is equivalent to the operating voltage VDD of the respective transistors. For example, the power supply voltage VDD1 is twice the power supply voltage VDD2. The core GND pad 201G is equivalent to the pad VGC for core GND, is electrically connected to the core GND line GLC for the core region 20. A the I/OGND line GL, and the core GND line GLC illustrated in FIG. 1, and is electrically connected via diodes 107, 108 for preventing noise propagation between GND. Those diodes also serve as an electrostatic protection mechanism, as described below.

The power supply line PL1 is electrically connected to the power supply pads 202 to transmit the power supply voltage VDD1. The power supply line PL2 is electrically connected to the power supply pads 203 to transmit the power supply voltage VDD2. Similar to FIG. 4, the resistive elements R1, R2, by dividing the power supply voltage VDD1, generates a reference voltage VREF equivalent to the power supply voltage VDD2. Thus, it is possible to constitute an embodiment of voltage divider circuit by the resistive elements R1, R2.

The voltage division ratio r (r<1) by the resistive elements R1, R2 is represented by r=VDD2/VDD1 (r=0.5 when VDD1=2·VDD2). A reference voltage line PLr transmits the reference voltage VREF.

The gate of the P-type transistor 101x, for example, by being electrically connected to the I/OGND line GL, is fixed to the ground voltage GND. On the other hand, a gate switch circuit 110n is arranged corresponding to the N-type transistor 102x. The gate switch circuit 110n controls the electrical connection destination of a gate node Ngn corresponding to the gate of the transistor 102x. Specifically, the gate switch circuit 110n selectively connects one of the power supply line PL2 (power supply voltage VDD1) and the reference voltage line PLr (reference voltage VREF) to the gate node Ngn in accordance with the voltage level (H/L) of the control signal SL.

The switch control circuit 130 generates a control signal SL for controlling the gate switch circuit 110n during operation of the semiconductor device 10. For example, under the power start sequence in which power supply voltage VDD1 is supplied prior to the power supply voltage VDD2, at the start time of the semiconductor device 10, so as to electrically connect the reference voltage line PLr to the gate node Ngn, the switch control circuit 130 sets the control signal SL (e.g., H level). Thereafter, after the timing of the power supply voltage VDD2 is supplied, the switch control circuit 130, so as to electrically connect the power supply line PL2 to the gate node Ngn, inverts the control signal SL (e.g., L level). Hereinafter, in the present embodiment, the operation time of the semiconductor device 10 means a state in which a predetermined power supply voltage is supplied to the power supply lines (PL1, PL2) including the execution period of the power supply start sequence.

In the semiconductor device 10 according to the first embodiment, an electrostatic protection mechanism 300 includes protection diodes 105, 106, ESD circuits 210, 211, diodes 107, 108, and an N-type transistor 115n. Further, the gate switch circuit 110 used during operation of the semiconductor device 10 functions as a part of the electrostatic protection mechanism 300 by operating as described above at the time of the application of the ESD.

FIG. 5 illustrates when an ESD is applied to an I/O signal pad 205 with a core GND pad 201G having a reference potential. That is, I/O signal pad 205 corresponds to one embodiment of a "signal pad". Further, a core GND pad 201G corresponds to one embodiment of a "GND pad". Further, a power supply line PL1 and an I/OGND line GL corresponds to each embodiment of a power supply line and a GND line.

The protection diodes 105 and 106, as same with FIG. 4, are electrically connected between the signal node Nio electrically connected to the I/O signal pad 205, and the power supply line PL1 and the I/OGND line GL, respectively. The ESD circuit 210, as in FIG. 4, is electrically connected between the power supply line PL1 and the I/OGND line GL. ESD circuit 211, as same with FIG. 4, is arranged between the power supply line PL2 for I/O and the I/OGND line GL.

When the ESD is applied, the protection diode 105 and the ESD circuit 210 is activated, so that, inside the semiconductor device 10, a discharge path 50 of the applied ESD is formed. In the discharge path 50, ESD current Iesd flows through the path of the I/O signal pad 205-protection diode 105-power supply line PL1-ESD circuit 210-I/OGND line GL-core GND line GLC-core GND pad 201G. By the ESD current Iesd, a potential difference Vdio1 is generated between the signal node Nio and the power supply line PL, and also, a potential difference Vesd is generated between the power supply line PL and the I/OGND line GL.

The diode 108 is electrically interposed and connected between the I/OGND line GL and the core GND line GLC. The diode 107 is anti-parallelly connected to the diode 108. The cathode of the diode 108 is electrically connected to the core GND pad 201G so as to pass the ESD current at the time of the upon ESD application. Thus, when ESD current is generated in the discharge path 50, a potential difference Vdio2 is generated between the anode and the cathode of the diodes 107, 108.

Figure 6:
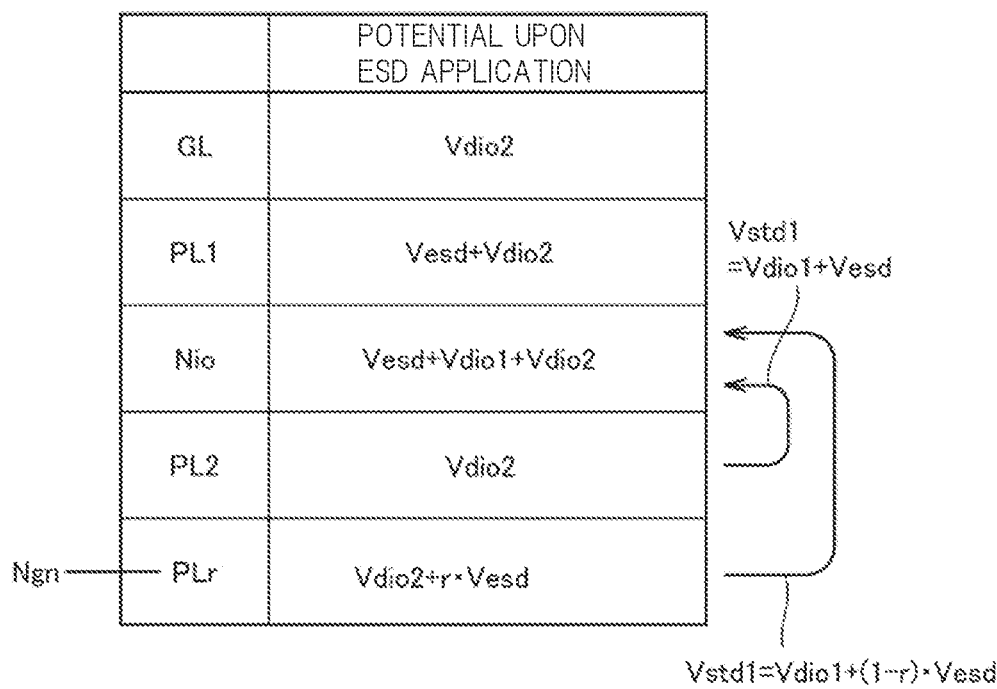
FIG. 6 is a chart for comparing the potential of each site at the time of the application of the ESD of the semiconductor device illustrated in FIG. 5.

As a result, at the time of the application of the ESD of the semiconductor device 10 according to the first embodiment, potentials illustrated in FIG. 6 are generated at each site.

First, with respect to the reference potential of the core GND pad 201G serving as a reference terminal at the time of the application of the ESD (0 [V]), the potential of the I/OGND line GL increases by the potential difference Vdio2 generated by the conduction of the diode 108. Furthermore, the potential of the power supply line PL1 is higher than the potential of the I/OGND line GL by the potential difference Vesd generated in accordance with the operation of the ESD-circuit 210.

Furthermore, the potential of the signal node Nio electrically connected to the I/O signal pad 205 is increased by the potential difference Vdio1 generated by the conduction of the protection diode 105 with respect to the potential of the power supply line PL1.

In contrast, the potential of the power supply line PL2 which is in the floating state is substantially equal to the potential of the I/OGND line GL (Vdio2). This is because, Vdio2 which is the potential of the I/OGND line GL is transmitted to the power supply line PL2 via the ESD-circuit 211. On the other hand, the potential of the reference voltage line PLr is indicated by the sum of the potential difference Vdio2 generated by the conduction of the diode 108, and the product (r·Vesd) of the potential difference Vesd between the power supply line PL1 and the I/OGND line GL and the partial pressure ratio r (r<1).

The potential difference Vstd1 applied between the gate and the drain of the transistor 102x varies depending on the gate connection destination. Specifically, at the time of the application of the ESD, when the gate node Ngn is electrically connected to the power supply line PL2, Vstd1 becomes equal to the potential difference between the signal node Nio and the GND pad 201 for I/O (Vstd1=Vdio1+Vesd). In contrast, when the gate node Ngn is electrically connected to the reference voltage line PLr, Vstd1 becomes Vstd1=Vdio1+(1−r)·Vesd, it is reduced by r·Vesd as compared with a case when connected to the power supply line PL2.

Referring again to FIG. 5, a transistor 115n has a drain electrically connected to the transmission node of the control signal SL and a source electrically connected to the cathode of the diode 108. The gate of the transistor 115n is electrically connected to the anode of the diode 108. The transistor 115n and the diodes 107 and 108 are designed so that the potential difference Vio2 generated in the diode 108 is larger than a threshold voltage Vth of the transistor 115n.

Thus, when an ESD current is generated in the discharge path 50, the transistor 115n is turned on in conjunction with the conduction of the diode 108, whereby the control signal SL can be forcibly set to the L level. That is, the diode 108 corresponds to one embodiment of a "current sensing diode" and the transistor 115n corresponds to one embodiment of a "control transistor". The gate switch circuit 110n, when the control signal SL is L level, is configured to electrically connect the gate of the transistor 102x to the reference voltage line PLr.

Figure 7:
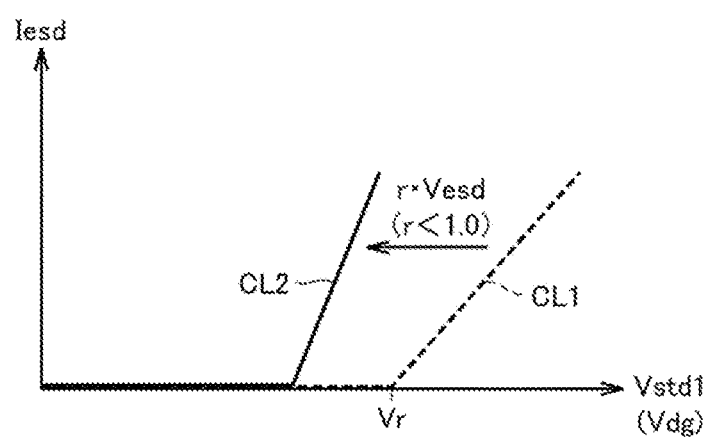
FIG. 7 is an operation characteristic diagram of an electrostatic protection mechanism of the semiconductor device according to the first embodiment.

FIG. 7 illustrates an operation characteristic diagram of the electrostatic protection mechanism 300 of the semiconductor device according to the first embodiment. The vertical axis of FIG. 7 illustrates the magnitude of the ESD current Iesd, and the horizontal axis illustrates the potential difference Vstd1 applied between the gate and the drain of the transistor 102x.

At the time of the application of the ESD, the relation between the gate node Ngn and the Vstd1–Iesd when the gate node Ngn is electrically connected to the power supply line PL2 is indicated by a characteristic line CL1 represented by a dotted line. On the other hand, the relation between the Vstd1–Iesd when the gate node Ngn is electrically connected to the reference voltage line PLr is indicated by a characteristic line CL2 represented by a solid line.

As described in FIG. 6, in the region where the ESD current Iesd is generated, the characteristic line CL1 becomes Vstd1=Vesd+Vdio1, while the characteristic line CL2 becomes Vstd1=r·Vesd+Vdio1 (r<0). Therefore, it is understood that, between the characteristic lines CL1 and CL2, for the same ESD current Iesd, the potential difference Vstd1 is reduced by r times (r·Vesd) of the potential difference Vesd, which is the voltage drop due to the ESD current.

As described above, in the semiconductor device 10 according to the first embodiment, the gate switch circuit 110n can appropriately control the gate connection destination of the N-type transistor 102x in the output circuit having the multi-stage vertical stacking configuration at the time of the application of the ESD. As a result, the potential difference Vstd1 applied between the gate and the drain of the N-type transistor 102x can be stably reduced, so that breakage of the transistor 102x at the time of the application of the ESD can be suppressed.

Further, the control signal SL (L level) of the gate switch circuit 110n at the time of the application of the ESD can be generated by conduction of the diode 108 and the transistor 115n in response to generation of an ESD current. Thus, at the time of the application of the ESD, the potential difference Vstd1 in the transistor 102x can be reduced without newly providing a structure for inputting the control signal SL from the outside of the semiconductor device 10.

Second Embodiment

In a second embodiment, relating to the P-type transistor constituting the output circuit of the semiconductor device 10, similarly to the first exemplary embodiment, an electrostatic protection configuration for reducing the potential difference applied between the gate and the drain at the time of the application of the ESD will be described.

Figure 8:
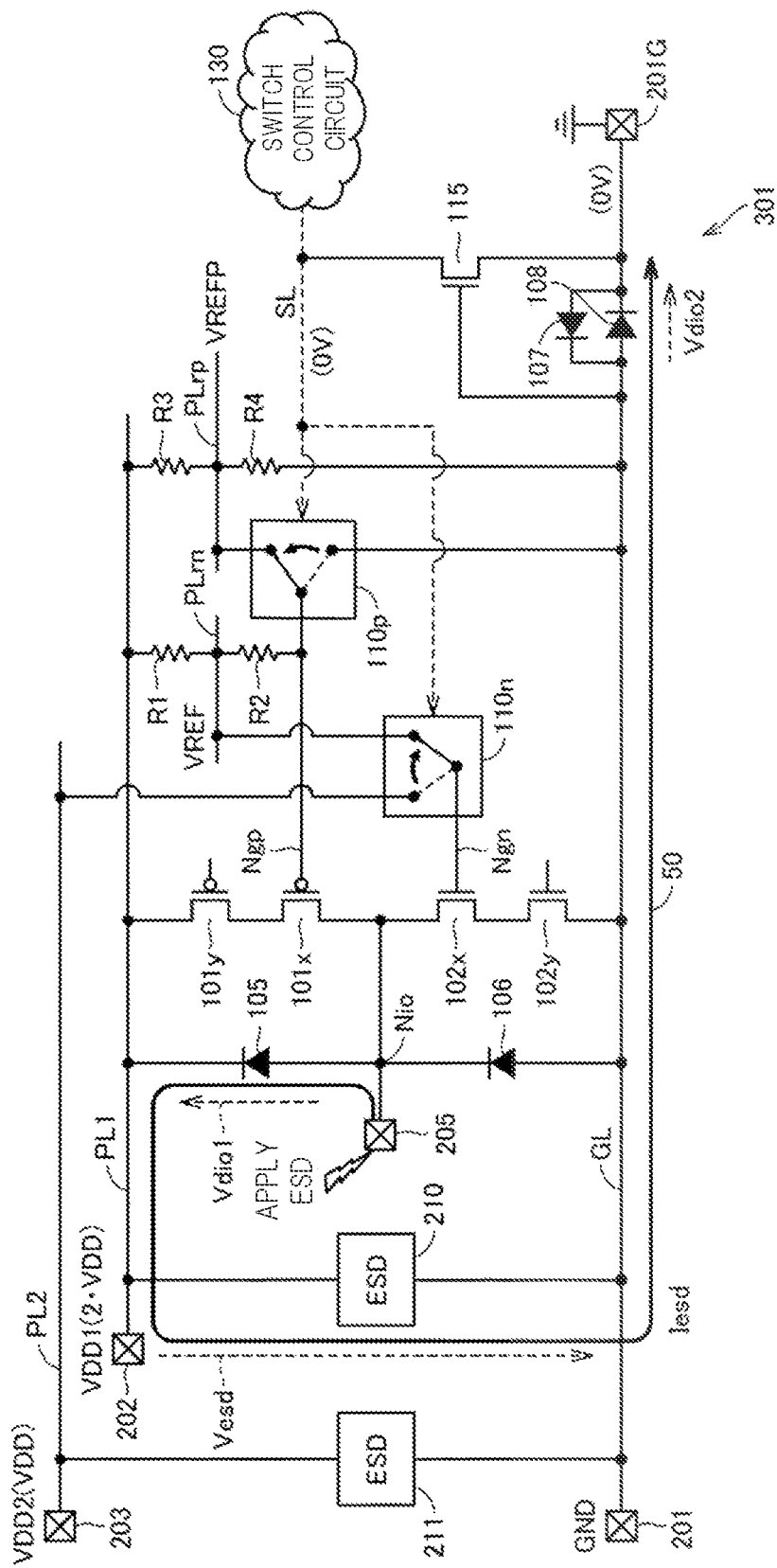
FIG. 8 is a circuit diagram illustrating an electrostatic protection mechanism of the semiconductor device according to the second embodiment.

As illustrated in FIG. 8, a electrostatic protection mechanism 301 of the semiconductor device 10 according to the second embodiment further. includes a gate switch circuit 110p as compared with the electrostatic protection mechanism 300 (FIG. 5) according to the first embodiment. The gate switch circuit 110p is arranged in a P-type transistor 101x having a drain electrically connected to the signal node Nio.

The gate switch circuit 110p is electrically connected between the gate node Ngp electrically connected to the gate of the transistor 101x and the I/OGND line GL and the reference-voltage line PLrp. The gate switch circuit 110p switches the gate connection destination according to the voltage level (H/L) of the control signal SL common to the gate switch circuit 110n.

The gate switch circuit 110p is configured to electrically connect the gate node Ngp to the I/OGND line GL (ground voltage GND) when the control signal SL is at H-level. As a result, during the operation of the semiconductor device 10, the transistor 101x can be fixed on. Unlike the gate switch circuit 110n arranged in the N-type transistor 102x, the gate switch circuit 110p is additionally arranged for the ESD application.

In contrast, when the control signal SL is forcibly set to the L level in response to the generation of the ESD current as described in the first embodiment, it is configured to electrically connect the gate node Ngp to the reference voltage line PLrp.

To the reference voltage line PLrp, the reference voltage VREFp obtained by dividing the power supply voltage VDD1 of the power supply line PL1 by the resistive elements R3, R4 is transmitted. That is, it is possible to constitute an embodiment of the voltage divider by the resistive elements R3, R4. Other configurations in FIG. 8 are the same as those in FIG. 5, and therefore detailed description thereof will not be repeated.

The drain of the transistor 101x of the plurality of P-type transistors constituting the output circuit of the semiconductor device 10 is connected to the signal node Nio electrically connected to the I/O signal pad 205. Therefore, when an ESD is applied while the gate node Ngp is electrically connected to the I/OGND line GL, a potential difference (Vdio1+Vesd) equivalent to that of the transistor 102x is applied between the gate and the drain of the transistor 101x.

On the other hand, when the gate node Ngp is electrically connected to the reference-voltage line PLrp at the time of the application of the ESD, the potential difference between the gate and the drain of the P-type transistor 101x can be reduced similarly to the transistor 102x in the first embodiment. Further, by controlling the operation of the gate switch circuit 110p as described above, the gate switch circuits 110n and 110p can share the control signal SL forcibly set to the L level (GND) in accordance with the generation of the ESD current.

As described above, in the semiconductor device according to the second embodiment, the gate switch circuit 110p is additionally arranged for applying an ESD to the P-type transistor 101x in the output circuit having the multi-stage vertical stacking configuration. Then, the gate connection destination of the transistor 101x at the time of the application of the ESD can be appropriately controlled by the gate switch circuit 110p to stably reduce the potential difference applied between the gate and the drain of the transistor 101x. As a result, breakdown of the transistor 101x at the time of the application of the ESD can be suppressed.

Also, the reference voltage VREFp may be equivalent to the reference voltage VREF. In this case, the gate switch circuit 110p is configured to electrically connect the reference voltage line PLr in the first embodiment and the gate node Ngp when the control signal SL is at L level. The arrangement of the resistive elements R3, R4 and the reference voltage line PLrp illustrated in FIG. 8 can be omitted.

Third Embodiment

In a third embodiment, an example of an arrangement layout of the electrostatic protection mechanism according to the first or second embodiment with respect to a plurality of output circuits will be described.

Figure 9:
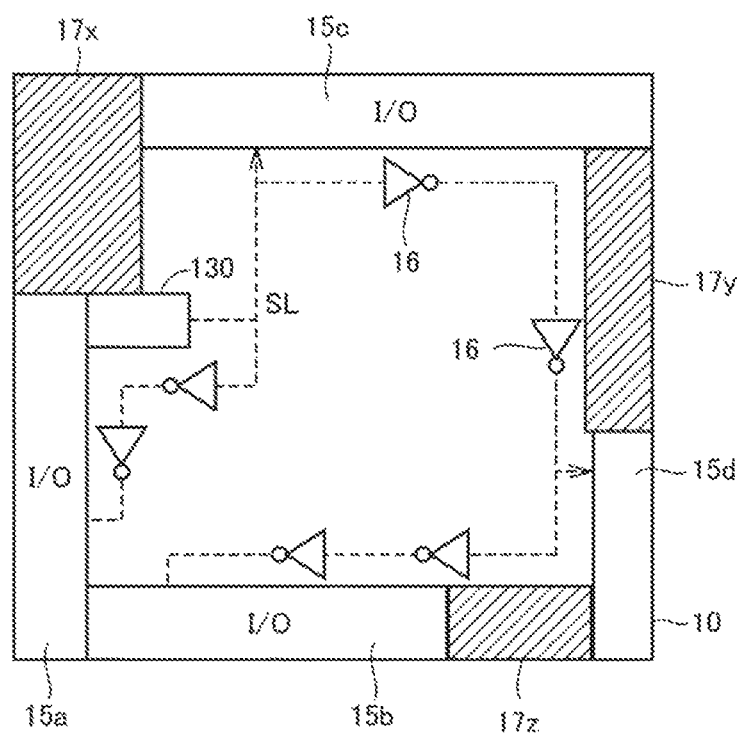
FIG. 9 is a conceptual diagram illustrating an example of the layout of the I/O circuit of the semiconductor device according to the third embodiment.

FIG. 9 is a conceptual diagram illustrating an example of the layout of the I/O circuit of the semiconductor device 10 according to the third embodiment.

As illustrated in FIG. 9, using at least a portion of the outer peripheral region of the semiconductor device 10, a plurality of I/O blocks 15 are arranged. In the example of FIG. 9, a configuration example in which four I/O blocks 15a to 15d are arranged is illustrated, but the number of I/O blocks 15 is arbitrary. In addition, analog circuit blocks can be arranged in the regions 17x to 17z between the I/O blocks 15.

Each I/O block 15 is provided with a plurality of I/O signal pads 205. Further, corresponding to each I/O signal pad 205, I/O circuit for inputting and outputting a digital signal (H level/L level) to the I/O signal pad is arranged. Such I/O circuit includes an output circuit comprised of transistors 101x, 101y, 102x, and 102y described in embodiments 1 and 2.

The switch control circuit 130 is shared among the plurality of I/O blocks 15a to 15d. That is, in each I/O block 15, the gate switch circuits 110n and 110p are controlled by a common control signal SL. The control signal SL may be transmitted to the I/O block 15 away from the switch control circuit 130 with amplification by a repeater configured by an even number of inverters 16.

Figure 10:
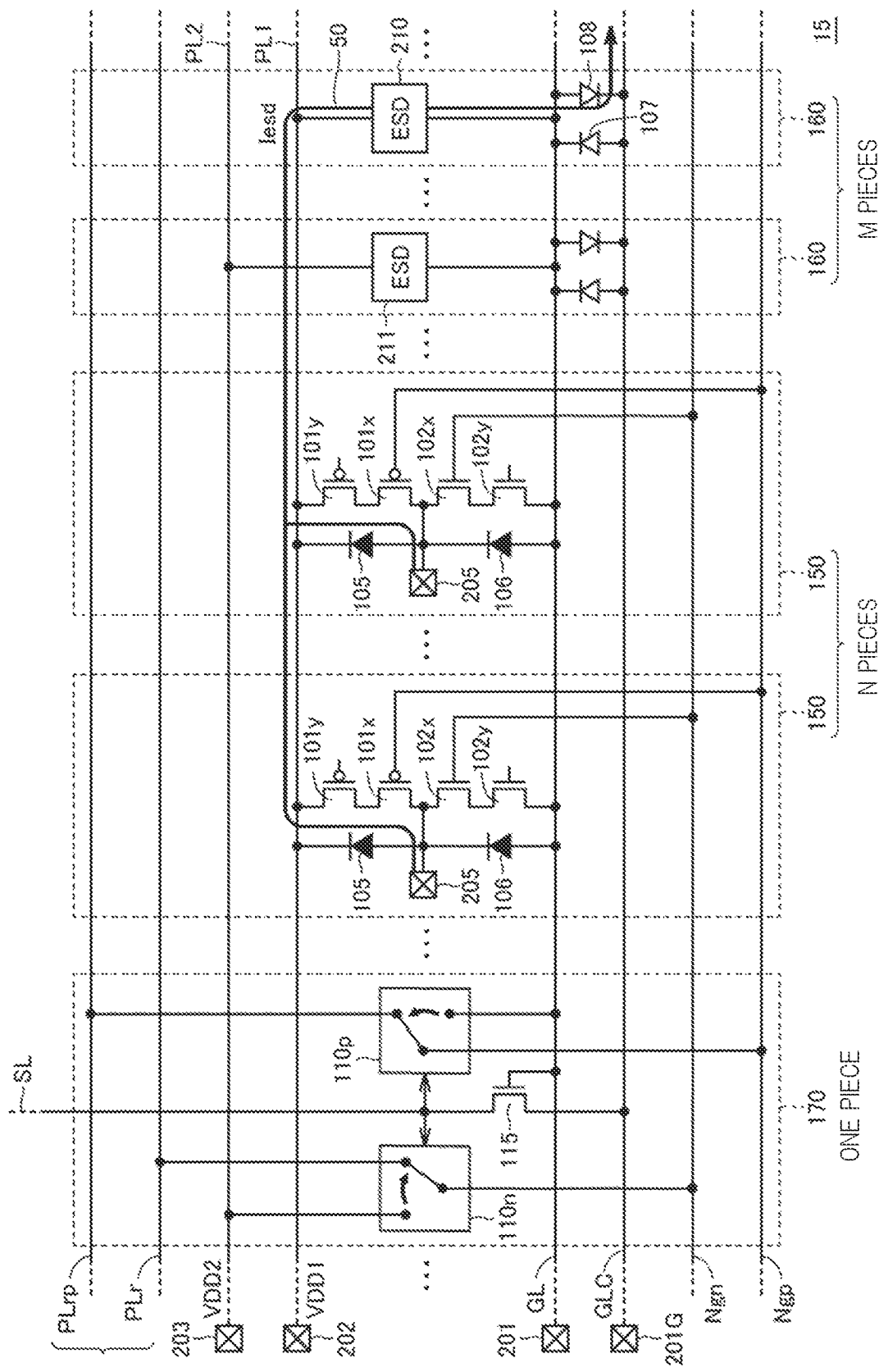
FIG. 10 is a circuit diagram illustrating an example of the arrangement layout of the electrostatic protection mechanism in the semiconductor device according to the third embodiment.

FIG. 10 illustrates an example of the layout of the electrostatic protection mechanism in each I/O block 15.

As illustrated in FIG. 10, N (N: an integer of 2 or more) pieces of circuit blocks 150 and M (M: a natural number) pieces of circuit blocks 160 are arranged in one I/O block 15.

The circuit blocks 150 are further provided with a configuration corresponding to the I/O circuit described above. Therefore, the circuit block 150, of the configuration described in the first and second embodiments, the I/O signal pad 205, transistors 101x, 101y, 102x, and 102y constituting the output circuit, and protection diodes 105, 106 are arranged.

The circuit blocks 160 are located for each level of different power supply voltages. In the example of FIG. 10, since the two types of power supply voltages VDD1 and VDD2 are supplied to the semiconductor device 10, M=2, and two circuit blocks 160 are arranged. In the two circuit blocks 160, ESD circuit 210 which is electrically connected between the power supply line PL1 (power supply voltage VDD1) and the I/OGND line GL, and, the ESD circuit 211 which is electrically connected between the power supply line PL2 (power supply voltage VDD2) and the I/OGND line GL are arranged, respectively. The circuit block 160 corresponds to a power supply cell 200 for I/O, as illustrated in FIG. 1.

Furthermore, in each circuit block 160, a diode 108 for passing the ESD current from the I/OGND line GL to the core GND line GLC, and a diode 107 connected in antiparallel with the diode 108 are arranged.

A circuit block 170 is arranged one in one I/O block 15. In the circuit block 170, gate switch circuits 110p and 110n and a transistor 115n are arranged. That is, the gate switch circuits 110p, 110n and the transistor 115n are shared between the N pieces of circuit blocks 150 in the same I/O block 15. That is, each circuit block 150 corresponds to an embodiment of an "input-output circuit", N pieces of circuit blocks 150 sharing the circuit block 170 corresponds to an embodiment of "a plurality of circuit blocks".

As described above, the control signal SL of the gate switch circuits 110p, 110n is common between the plurality of I/O blocks 15a to 15d. Therefore, in each I/O block 15, the gate node Ngn electrically connected to the gate of the transistor 102x in the M pieces of circuit blocks 150 is also shared among the plurality of I/O blocks 15a to 15d. Similarly, the gate node Ngp electrically connected to the gate of the transistor 101x in the M pieces of circuit blocks 150 is also shared among the plurality of I/O blocks 15a to 15d.

In this manner, only one circuit block 170 composed of elements for reducing the potential difference between the gate and the drain of the transistors 101x and 102x at the time of the application of the ESD needs to be arranged in each I/O block 15. That is, the gate switch circuits 110p and 110n and the transistor 115n can be shared among the N pieces of circuit blocks 150 that need to be arranged for each of the plurality (N) of I/O signal pads 205. In addition, the transistor 115n for electrically connecting the control signal SL to the core GND pad 201G in response to the ESD current generation can be configured to have a relatively small transistor size. For example, the transistor 115n may have a gate width of about several (μm) to about ten or more (μm).

As described above, according to the arrangement layout of the semiconductor device according to the third embodiment, it is possible to suppress the area occupied by the circuit elements which are additionally arranged to suppress the breakdown of the transistors 101x and 102x at the time of the application of the ESD, as described in the first and second embodiments.

Fourth Embodiment

In a fourth embodiment, a modification of the forced setting of the control signal of the gate switch circuit in accordance with the occurrence of the ESD current.

Figure 11:
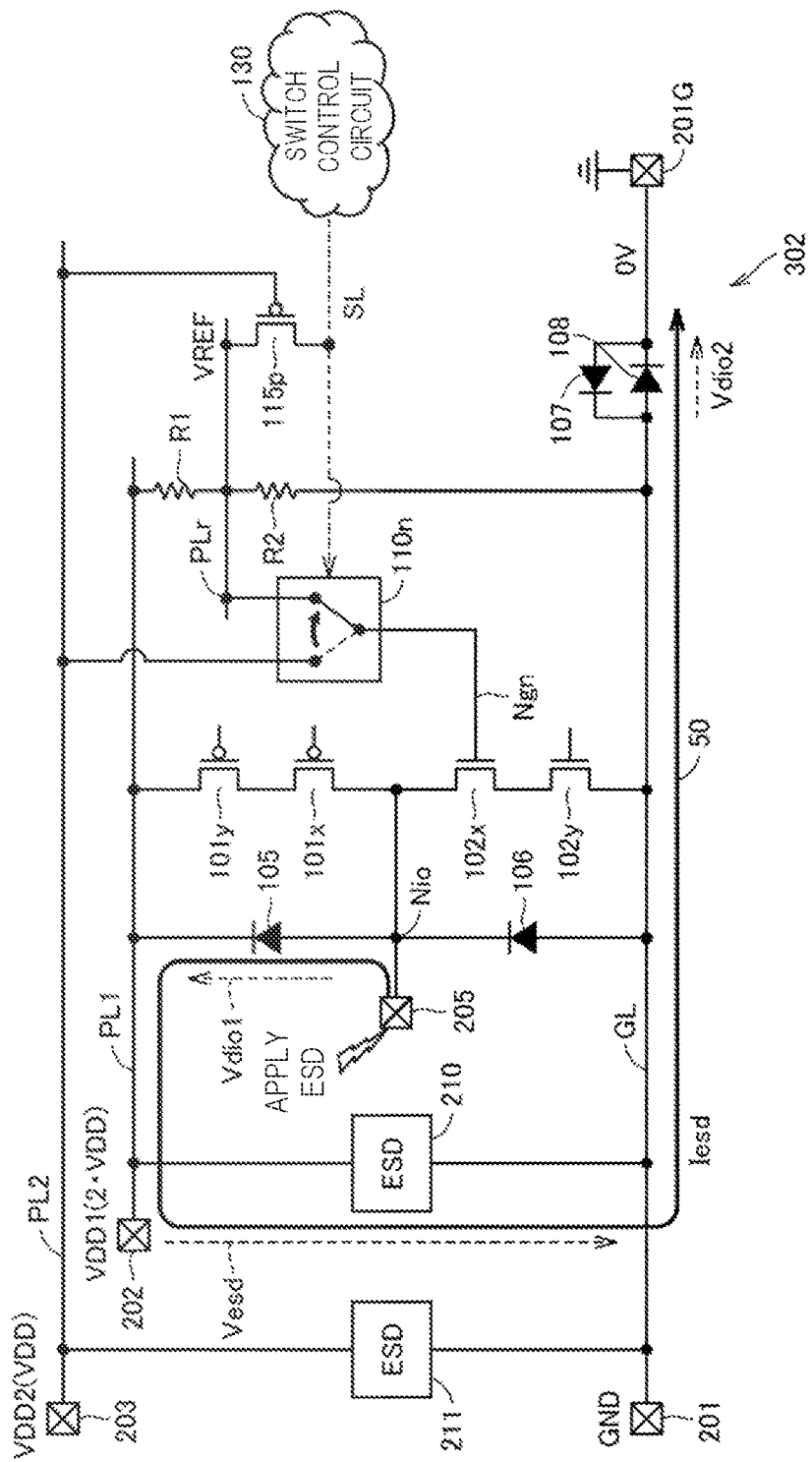
FIG. 11 is a circuit diagram illustrating an electrostatic protection mechanism of the semiconductor device according to the fourth embodiment.

As illustrated in FIG. 11, the electrostatic protection mechanism 302 of the semiconductor device according to the fourth embodiment differs from the electrostatic protection mechanism 300 (FIG. 5) according to the first embodiment in that it includes a P-type transistor 115p instead of the N-type transistor 115n.

The transistor 115p has a drain electrically connected to the transmission node of the control signal SL and a source electrically connected to the reference voltage line PLr (reference voltage VREF). The gate of transistor 115p is electrically connected to the power supply line PL2. Other configurations in FIG. 8 are the same as those in FIG. 5, and therefore detailed description thereof will not be repeated.

As described in FIGS. 5 and 6, when the ESD applied to the signal pad 205 by setting the core GND pad 201G to the reference terminal, since the floating state, by the potential of the I/OGND line GL is transmitted through the ESD circuit 211 (FIG. 4), the potential of the power supply line PL2 becomes Vdio2. On the other hand, in response to the generation of the ESD current Iesd, the diode 108 is conducted, the potential of the reference voltage line PLr is raised to Vdio2+r·Vesd. In response to this, the transistor 115p is turned on by the gate becomes low potential with respect to the source, the control signal SL is forcibly set to H level (Vdio2+r·Vesd). That is, in the fourth embodiment, the transistor 115p corresponds to an example of the "control transistor". That is, a voltage equal to or higher than the power supply voltage VDD, which is the operation voltage of the transistors 101x, 101, 102x, and 102y, is transmitted from the transistor 115p to the gate switch circuit 110n.

Therefore, in the fourth embodiment, in contrast to the first embodiment, the gate switch circuit 110n is configured to electrically connect the gate of the transistor 102x to the reference voltage line PLr when the control signal SL is at the H level. In contrast to the first embodiment, the gate switch circuit 110n is configured to electrically connect the gate of the transistor 102x to the power supply line PL2 when the control signal SL is at L level.

During operation of the semiconductor device 10, the power supply voltage VDD2 is supplied to the power supply line PL2, and the reference voltage VREF corresponding to the power supply voltage VDD2 is also supplied to the reference voltage line PLr. Therefore, the transistor 115p is turned off because the gate and the source are at approximately the same potential. Thus, the gate switch circuit 110n switches the gate connection destination of the transistor 102x in accordance with the control signal SL from the switch control circuit 130. In the fourth embodiment, also for the switch control circuit 130, it is configured to set the control signal SL to L level in a period to electrically connect the gate node Ngn to the power supply line PL2. Conversely, the switch control circuit 130 sets the control signal SL to the H level in a period in which the gate node Ngn should be electrically connected to the reference voltage line PLr.

As described above, in the semiconductor device according to the fourth embodiment, by forcibly setting the voltage level of the control signal SL of the gate switch circuit 110n in accordance with the generation of the ESD current using the P-type transistor, the same effect as that of the first embodiment can be obtained. That is, the gate connection destination of the transistor 102x at the time of the application of the ESD can be appropriately controlled to suppress breakdown of the transistor 102x at the time of the application of the ESD.

In the configuration of FIG. 11, the gate switch circuit 110p illustrated in FIG. 8 may be further arranged to combine the fourth embodiment with the second embodiment. In this case, unlike the second embodiment, the gate switch circuit 110p is also configured so that the gate node Ngp is electrically connected to the reference-voltage line PLrp or the reference-voltage line PLr when the control signal SL is at the H level. That is, when the second and fourth embodiments are combined, the gate switch circuit 110p is configured to electrically connect the gate node Ngp to the I/OGNDGL when the control signal SL is at L-level.

It is also possible to apply the layout of the third embodiment to the fourth embodiment or a combination of the second and fourth embodiments. In this case, in the circuit block 170 of FIG. 10, a P-type transistor 115p can be arranged instead of the N-type transistor 115n.

Fifth Embodiment

In a fifth embodiment, an electrostatic protection mechanism of an output circuit having a multi-stage vertical stacking configuration in a semiconductor device having a power supply voltage of one type will be described.

Figure 12:
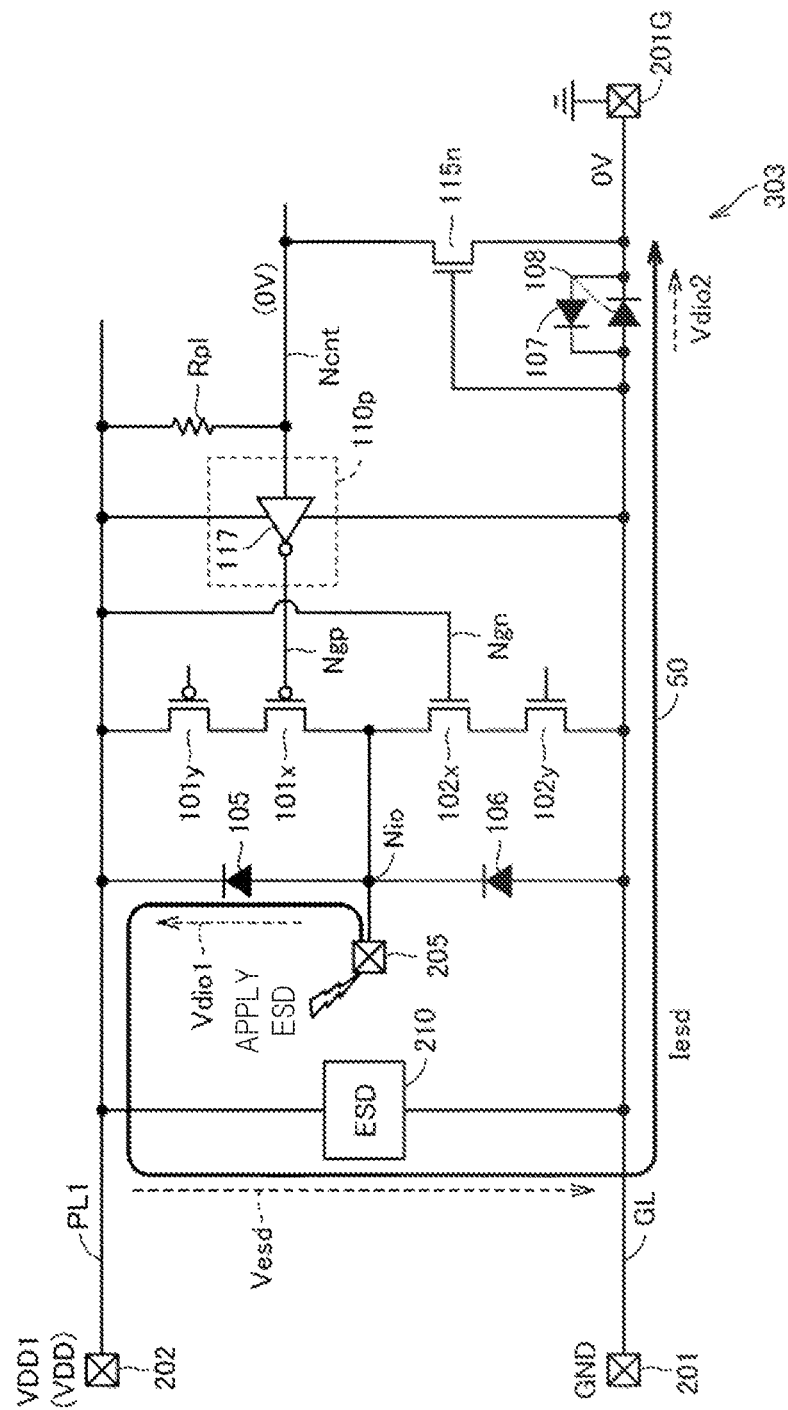
FIG. 12 is a circuit diagram illustrating an electrostatic protection mechanism of the semiconductor device according to the fifth embodiment.

As illustrated in FIG. 12, in the semiconductor device 10 according to the fifth embodiment, an output circuit includes P-type transistors 101x, 101y and N-type transistors 102x, 102y similar to the first embodiment (FIG. 5).

The electrostatic protection mechanism 303 of the semiconductor device according to the fifth embodiment includes protection diodes 105, 106, an ESD circuit 210, an N-type transistor 115n, and diodes 107, 108 which are arranged similarly to the first embodiment (FIG. 5).

On the other hand, in the semiconductor device according to the fifth embodiment, the power supply line PL1 is supplied with the power supply voltage VDD1 corresponding to the operating voltage VDD (e.g., 1.8 [V]) of the transistors 101x, 101y, 102x, and 102y through the power supply pads 202. Therefore, the N-type transistor 102x having the drain electrically connected to the signal node Nio is fixed to the on-state by electrically connecting the gate (gate node Ngn) to the power supply line PL1.

Further, the electrostatic protection mechanism 303 includes a gate switch circuit 110p formed by an inverter 117. The gate switch circuit 110p (inverter 117) switches the gate connection destination of the P-type transistor 101x having a drain electrically connected to the signal node Nio between the power supply line PL1 and the I/OGND line GL.

An input node Ncnt of the invertor 117 is electrically connected with the drain of the transistor 115n, as well as electrically connected with the power supply line PL1 via the pull-up resistor Rp1. Similar to the first embodiment illustrated in FIG. 5, the transistor 115n is turned on in conjunction with the conduction of the diode 108 due to the generation of the ESD current.

Since the transistor 115n is turned off during operations other than ESD-application, including of the semiconductor device, a H (high) level voltage (power supply voltage VDD1) is input to the inverter 117. Thereby, the inverter 117 electrically connects the gate node Ngp to the I/OGND line GL. As a result, the P-type transistor 101x is fixed to the ON state.

In contrast to this, when an ESD is applied while the core GND pads 201G have a reference potential, an L-level voltage (ground voltage GND) is input to the inverters 117 by turning on the transistors 115n in response to the ESD current flowing through the discharge path 50. Thus, the inverter 117 electrically connects the gate node Ngp to the power supply line PL1. As described above, in the electrostatic protection mechanism 303 of the fifth embodiment, the gate-connection destination of the P-type transistor 101x is switched from the I/OGND line GL to the power supply line PL1 at the time of the application of the ESD.

Further, when ESD is applied while the core GND pad 201G has a reference potential, in the discharge path 50 of the ESD current, the same potential differences Vdio2, Vesd, and Vdio as in the first embodiment (FIG. 5) are generated. As a result, at the time of the application of the ESD of the semiconductor device 10 according to the fifth embodiment, the potential illustrated in FIG. 13 at each site is generated.

Figure 13:
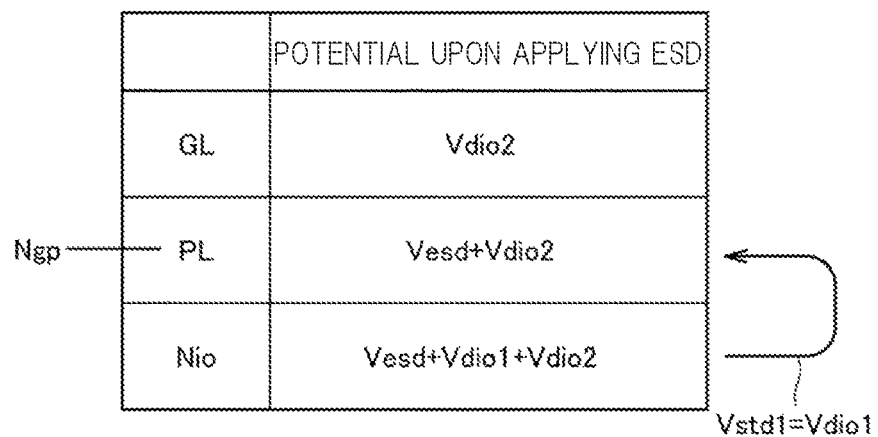
FIG. 13 is a diagram for comparing the potential of each site at the time of the application of the ESD of the semiconductor device illustrated in FIG. 12.

As illustrated in FIG. 13, the potential of the I/OGND line GL increases by the potential difference Vdio2 generated by the conduction of the diode 108 with respect to the reference potential (0 [V]) of the core GND pad 201G. Furthermore, the potential of the power supply line PL1 is higher than the potential of the I/OGND line GL by the potential difference Vesd generated in accordance with the operation of the ESD-circuit 210.

Further, the potential of the signal node Nio (I/O signal pad 205) electrically connected to the drain of the transistor 101x is higher than the potential of the power supply line PL1 by the potential difference Vdio1 generated by the conduction of the protection diode 105.

Therefore, if the gate node Ngp remains electrically connected to the I/OGND line GL at the time of the application of the ESD, the potential difference Vstd1 applied between the gate and the drain of the transistor 102x becomes Vesd+Vdio1 at the time of the ESD current generation.

In contrast to this, since the gate node Ngp is electrically connected to the power supply line PL1 by the inverters 117, the potential difference Vstd1 applied between the gate and the drain of the transistor 102x when the ESD current is generated is reduced to Vdio1.

Figure 14:
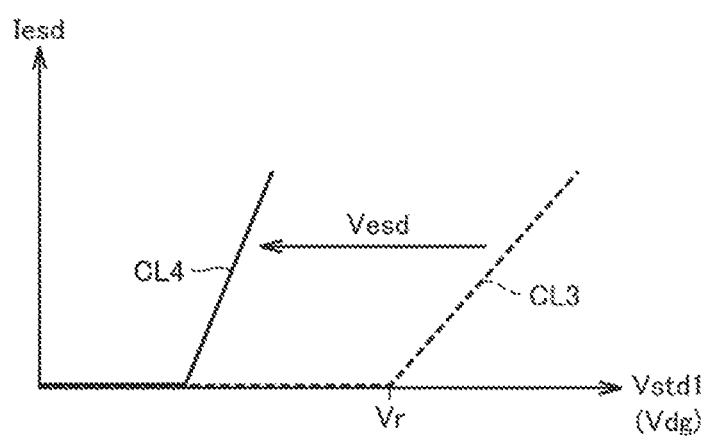
FIG. 14 is an operation characteristic diagram of an electrostatic protection mechanism of the semiconductor device according to the fifth embodiment.

In FIG. 14, an operation characteristic diagram of an electrostatic protection mechanism 303 of the semiconductor device according to the fifth embodiment is illustrated. Similar to FIG. 7, the vertical axis and the horizontal axis of FIG. 14 indicate the magnitude of the ESD current Iesd and the potential difference Vstd1 applied between the gate and the drain of the transistor 102x, respectively.

The relation between the gate node Ngp and Vstd1−Iesd when the gate node Ngp is electrically connected to the I/OGND line GL at the time of the application of the ESD is indicated by a characteristic line CL3 represented by a dotted line. On the other hand, the relation between the gate node Ngn and Vstd1−Iesd when the gate node Ngn is electrically connected to the power supply line PL1 is indicated by a characteristic line CL4 represented by a solid line.

As described with reference to FIG. 13, in the region where the ESD current Iesd is generated, the ESD current becomes Vstd1=Vesd+Vdio1 in the characteristic line CL3, while the ESD current becomes Vstd1=Vesd in the characteristic line CL4. Therefore, it is understood that, for the same ESD current Iesd, the potential difference Vstd1 is reduced by the potential difference Vesd, which is the voltage drop due to the ESD current, between the characteristic lines CL3 and CL4.

As described above, in the semiconductor device 10 according to the fifth embodiment, the gate connection destination of the P-type transistor 101x in the output circuit having the multi-stage vertical stacking configuration at the time of the application of the ESD can be controlled by arranging the gate switch circuit 110p for ESD application. As a result, the potential difference Vstd1 applied between the gate and the drain of the P-type transistor 101x can be stably reduced, so that breakage of the transistor 101x at the time of the application of the ESD can be suppressed.

In addition, the layout of the third embodiment can be applied to the fifth embodiment. In this case, in the circuit block 170 of FIG. 10, the inverter 117 illustrated in FIG. 12 is arranged as the gate switch circuit 110p, and the arrangement of the gate switch circuit 110n is omitted.

Sixth Embodiment

In a sixth embodiment, a modification of the gate connection destination by the gate switch circuit 110n in the first to fourth embodiments will be described.

Figure 15:
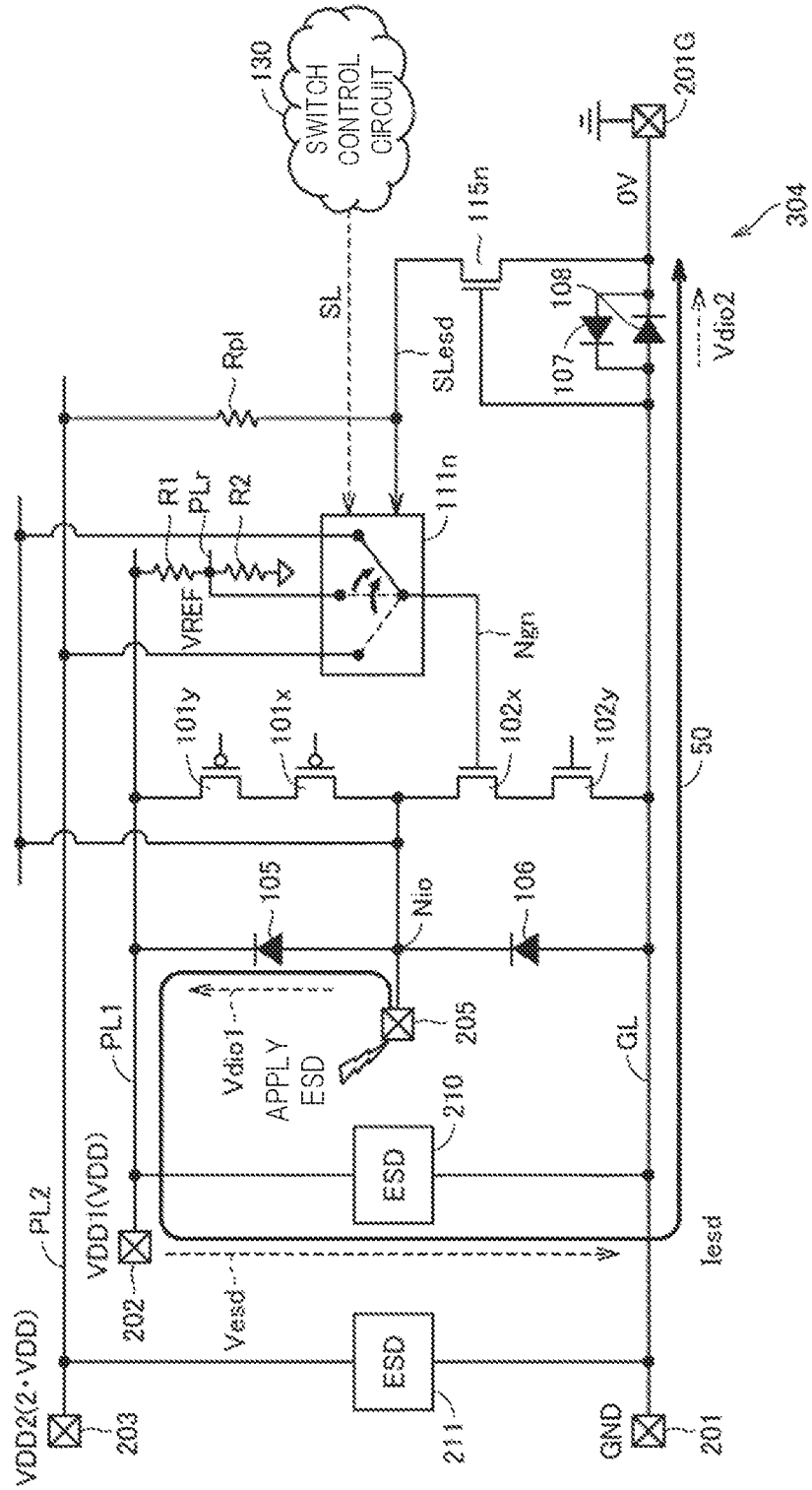
FIG. 15 is a circuit diagram illustrating an electrostatic protection mechanism of a semiconductor device according to the sixth embodiment.

As illustrated in FIG. 15, the electrostatic protection mechanism 304 of the semiconductor device according to the sixth embodiment differs in that it contains the gate switch circuit 111n instead of the gate switch circuit 110n compared to the electrostatic protection mechanism 300 (FIG. 5) according to the first embodiment.

In addition to the function of the gate switch circuit 110n corresponding to the control signal SL, the gate switch circuit 111n further has a function of electrically connecting the gate node Ngn to the signal node Nio (I/O signal pad 205) in accordance with the ESD control signal SLesd.

The ESD control signal SLesd is input to the gate-switch circuits 111n in response to the transistor 115n being turned on by the generation of the ESD current in the discharge path 50. That is, when the ESD control signal SLesd is set to L-level, the gate switch circuit 111n electrically connects the gate node Ngn to the signal node Nio. On the other hand, when the transistor 115n is turned off, the ESD control signal SLesd is fixed to the H level (power supply voltage VDD2) by the pull-up resistor Rp1.

When the ESD control signal SLesd is set to the H level, the gate switch circuit 111n selectively connects one of the power supply line PL1 and the reference voltage line PLr to the gate node Ngn in accordance with the control signal SL from the switch control circuit 130, similarly to the gate switch circuit 110n. As a result, the transistor 102x can be fixed to the on state during the operation of the semiconductor device 10.

Other configurations in FIG. 15 are the same as those in FIG. 5, and therefore detailed description thereof will not be repeated. That is, even in the electrostatic protection mechanism 304 according to the sixth embodiment, the protection diodes 105, 106, the ESD circuit 210, the N-type transistor 115n, and the diodes 107, 108 are arranged in the same manner as in the first embodiment (FIG. 5).

Figure 16:
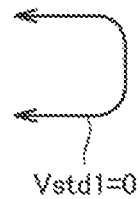
FIG. 16 is a diagram for comparing the potential of each site at the time of the application of the ESD of the semiconductor device illustrated in FIG. 15.

Therefore, when ESD is applied, in the discharge path 50 of the ESD current, the same potential differences Vdio2, Vesd, and Vdio same as those in the first embodiment (FIG. 5) are generated. As a result, at the time of the application of the ESD of the semiconductor device 10 according to the sixth embodiment, the potential illustrated in FIG. 16 is generated at each site.

First, the potential of the I/OGND line GL, with respect to the reference potential (0 [V]) of the core GND pad 201G as a reference at the time of the application of the ESD rises by the potential difference Vdio2 generated by the conduction of the diode 108. Furthermore, the potential of the power supply line PL1 is higher than the potential of the I/OGND line GL by the potential difference Vesd generated in accordance with the operation of the ESD circuit 210.

Further, the potential of the signal node Nio (I/O signal pad 205) electrically connected to the drain of the transistor 101x becomes higher than the potential of the power supply line PL1 by the potential difference Vdio1 generated by the conduction of the protection diode 105 (Vesd+Vdio1+Vdio2).

On the other hand, since the gate node Ngn is electrically connected to the signal node Nio by the gate switch circuit 111n, the gate node Ngn has the same potential as the signal node Nio. As a result, the potential difference Vstd1 applied between the gate and the drain of the transistor 102x can be set to 0 (Vstd1=0).

Figure 17:
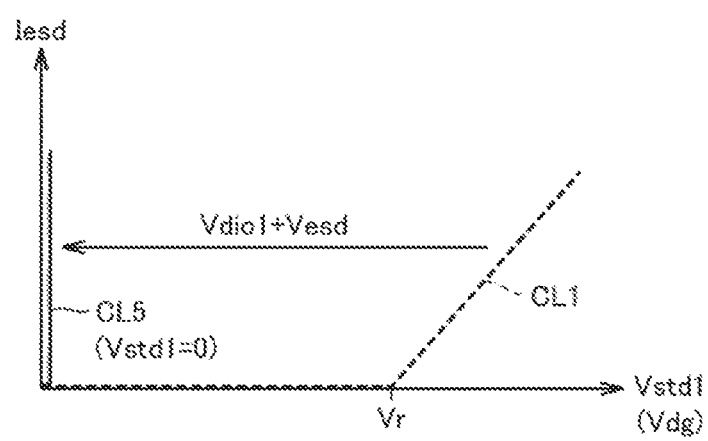
FIG. 17 is an operation characteristic diagram of the electrostatic protection mechanism of the semiconductor device according to the sixth embodiment.

In FIG. 17, an operation characteristic diagram of an electrostatic protection mechanism 304 of the semiconductor device according to the sixth embodiment is illustrated. The vertical and horizontal axes of FIG. 17 illustrate the magnitude of the ESD current Iesd and the potential difference Vstd1 applied between the gate-drains of transistor 102x, respectively, as same with FIG. 7.

At the time of the application of the ESD, the relation between Vstd1−Iesd when the gate node Ngp is electrically connected to the power supply line PL2 outside the path of the ESD current is indicated by a similar characteristic line CL1 (dotted line) as in FIG. 7. On the other hand, the relation between Vstd1−Iesd when the gate node Ngn is electrically connected to the signal node Nio (I/O signal pad 205) is indicated by a characteristic line CL5 represented by a solid line.

In the region where the ESD current Iesd is generated, the characteristic line CL1 becomes Vstd1=Vesd+Vdio1 as described in the first embodiment, while the characteristic line CL5 becomes Vstd1=0.

As described above, in the semiconductor device 10 according to the sixth embodiment, the gate connection destination at the time of the application of the ESD can be controlled to the signal node Nio by the arrangement of the gate switch circuit 111n. As a result, the potential difference Vstd1 applied between the gates and the drains of the transistors 102x in the output circuit having the multi-stage vertical stacking structure can be stably reduced, so that breakdown of the transistor 102x at the time of the application of the ESD can be suppressed.

In the sixth embodiment, a resistive element or a diode may be interposed and connected to the connection path of the signal node Nio and the gate node Ngn by the gate switch circuit 111n. In this case, the diode is arranged so that the anode is electrically connected to the signal Nio. That is, the signal node Nio, or a node coupled to the signal node Nio via a resistive element or a diode in a conducting state is a gate connection destination at the time of the application of the ESD.

It is also possible to combine the second embodiment with the sixth embodiment. That is, a gate switch circuit 111p (not illustrated) for electrically connecting the gate node Ngp to the signal node Nio at the time of the application of the ESD can be additionally arranged in the configuration of FIG. 15.

Alternatively, as same with the fourth embodiment, the ESD control signal SLesd can be generated by arranging a P-type transistor 115p similar to that in FIG. 11 instead of the N-type transistor 115n. In this instance, the gate switch circuits 111n and 111p are configured to electrically connect the gate nodes Ngn, Ngp to the signal node Nio when the ESD control signal SLesd is at the H level (power supply voltage VDD2). Further, instead of the pull-up resistor Rp1 illustrated in FIG. 15, a pull-down resistor (not illustrated) for fixing the ESD control signal SLesd to the L level when the transistor 115p is turned off is arranged.

Further, it is also possible to apply the layout of the third embodiment to the semiconductor device according to the sixth embodiment. In this case, the gate switch circuits 111n and 111p and the pull-up resistor Rp1 (or, pull-down resistor) may be arranged in the circuit block 170 of FIG. 10.

Figure 18:
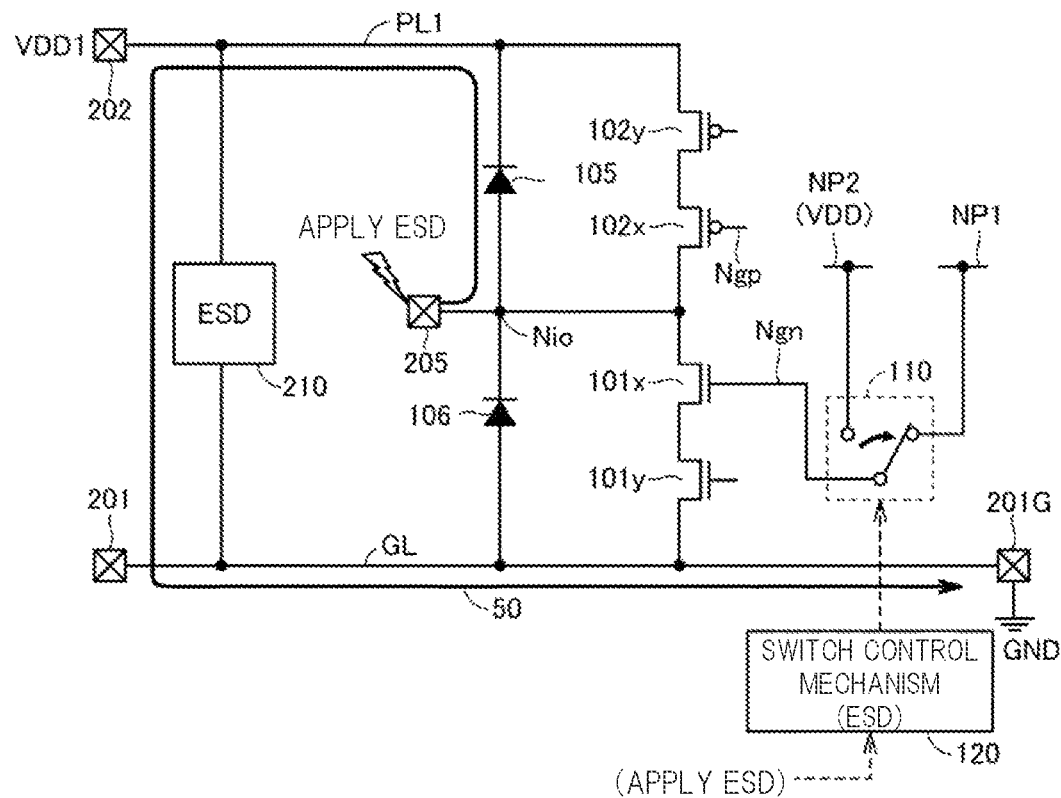
FIG. 18 is a circuit diagram illustrating a comprehensive concept of an electrostatic protection mechanism of a semiconductor device according to the present embodiment.

The comprehensive concept of the electrostatic protection mechanism of the semiconductor device according to the present embodiment described above is illustrated by the circuit diagram illustrated in FIG. 18.

As illustrated in FIG. 18, it is understood that the electrostatic protection mechanism of the semiconductor device according to the present embodiment includes the protection diodes 105, 106, the ESD circuit 210, a gate switch circuit 110 for controlling the gate connection destination of the transistor to be protected when ESD is applied, and a switch control mechanism 120 for controlling the gate switch circuit 110.

The gate switch circuit 110 is intended to encompass the gate switch circuits 110n, 110p, 111n, and 111p described in the first to sixth embodiments. The gate switch circuit 110 is arranged corresponding to at least one of the transistors 101x and 102x having drains electrically connected to the I/O signal pad 205 (signal node Nio) among the plurality of transistors constituting the output circuit of the semiconductor device.

In FIG. 18, a configuration in which the gate switch circuit 110 is arranged only for the transistor 102x is illustrated as an example. Alternatively, unlike FIG. 18, the gate switch circuit 110 may be arranged only for the transistor 101x or for each of the transistors 101x and 102x. As described above, since the gate switch circuit 110 is used for the N-type transistor 101x during the operation of the semiconductor device 10, it is not necessary to additionally dispose the gate switch circuit 110 for the time of the ESD application.

By electrically connecting the gate node Ngn or Ngp to the first node NP1, the gate switch circuit reduces the potential difference applied between the gate and the drain of the transistor 101x or 102x at the time of the application of the ESD. The first node NP1 includes a reference voltage lines PLr, PLrp in the first to fourth embodiments, the power supply line PL1 in the fifth embodiment, and the signal node Nio, or, a node coupled with the signal node Nio via a resistive element or a diode in a conducting state in the sixth embodiment. That is, the first node NP1 generally indicates a node having a potential higher than that of the I/OGND line GL in response to generation of the ESD current in the discharge path 50.

In the first to sixth embodiments, an electrostatic protection mechanism for a plurality of transistors constituting an output circuit of a multi-stage vertical stacking configuration suitable for miniaturized transistors is described. Therefore, the gate switch circuit 110 electrically connects the gate node Ngn (Ngp) to the second node NP2 for supplying the gate voltage for turning on the transistors 101x and 102x when the semiconductor device is operated. The second node NP2 includes a power supply line PL2 for the transistor 102x (first to fourth embodiments) and an I/OGND line GL for the transistor 101x (second and fifth embodiments). As described above, the power supply line PL2 supplies the operating voltage VDD of the transistors 101x, 101y, 102x, and 102y. From the foregoing description, it will be understood that the second node NP2 is not necessarily included in the ESD current path (i.e., discharge path 50).

The switch control mechanism 120 may be configured by an N-type transistor 115n (FIG. 5, etc.) or a P-type transistor 115p (FIG. 11) and the diode 108. The switch control mechanism 120 is not limited to the illustrated configuration as long as the gate switch circuit 110 (110n, 110p, 111n, 111p) can be controlled in the same manner as described in the first to sixth embodiments, and any configuration can be adopted. With this configuration, at the time of the application of the ESD, without inputting a signal from the outside of the semiconductor device 10, it is possible to control the gate switch circuit 110.

Above, in this embodiment, the application of the electrostatic protection mechanism to the output circuit constituted by a series connection of two P-type and N-type transistors (drive transistors) has been described. However, the electrostatic protection mechanism according to the present embodiment is also applicable to an output circuit configured by a series connection of three or more P-type and N-type transistors (drive transistors). Even in such a configuration, in the transistor (transistor to be protected) having a drain connected to the signal node Nio, the potential difference between the drain and the gate is maximized when ESD is applied. Therefore, by arranging the gate switch circuit 110 at least in part or all of the transistor to be protected, breakdown of the transistor at the time of the application of the ESD can be suppressed.

Furthermore, the electrostatic protection mechanism of the semiconductor device according to the present embodiment can also be applied to a semiconductor device having an output circuit of a single-stage configuration constituted by one of the P-type and N-type transistors.

Figure 19:
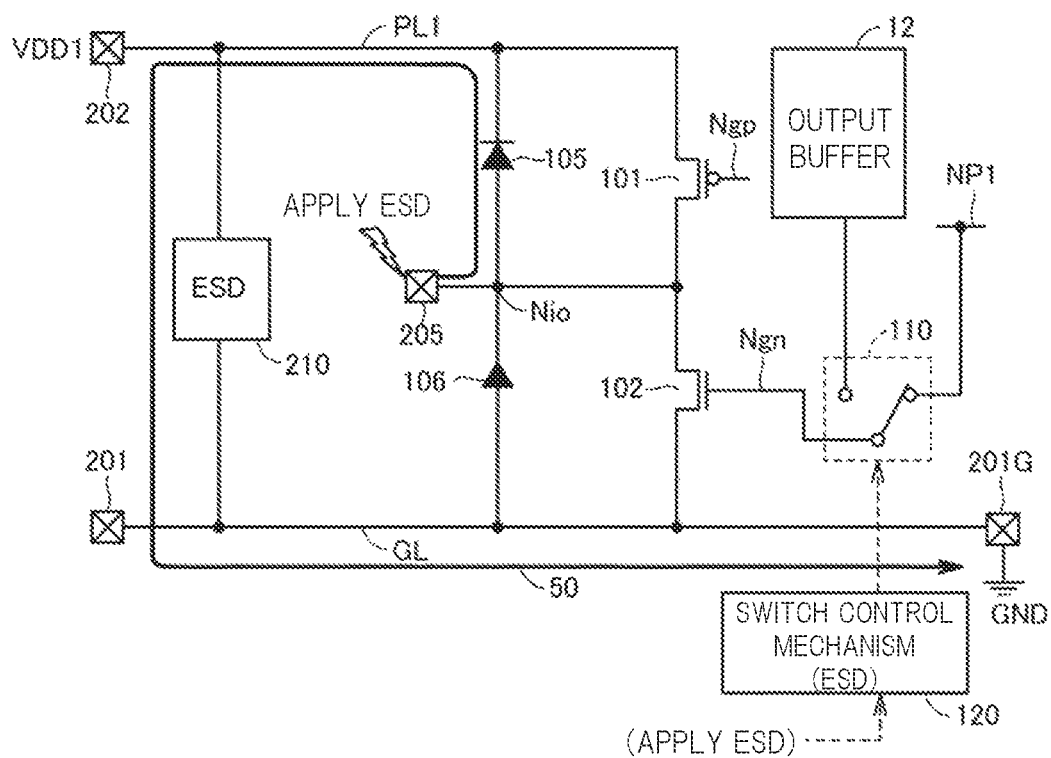
FIG. 19 is a circuit diagram illustrating a comprehensive concept of an electrostatic protection mechanism of a semiconductor device according to a modification of the present embodiment.

As illustrated in FIG. 19, a single stage output circuit includes a P-type transistor 101 and an N-type transistor 102, similar to FIG. 2. That is, in a modification of FIG. 19, transistors 101 and 102 correspond to one embodiment of a "plurality of drive transistors". In particular, the P-type transistor 101 corresponds to a "first transistor" and a "transistor to be protected". Similarly, the N-type transistor 102 corresponds to the "second transistor" and a "transistor to be protected".

Also, in a modification of FIG. 19, the electrostatic protection mechanism of the semiconductor device according to this embodiment includes protection diodes 105, 106, an ESD circuit 210, a gate switch circuit 110 for controlling the gate connection destination of the transistor to be protected at the time of the application of the ESD, and a switch control mechanism 120 similar to that of FIG. 18.

In a modification of FIG. 19, each of transistors 101 and 102 has a drain electrically connected to an I/O signal pad 205 (signal node Nio). Accordingly, the gate switch circuit 110 is arranged corresponding to at least one of the transistors 101 and 102. Also in FIG. 19, the configuration in which the gate switch circuit 110 is arranged with respect to only the transistor 102 is illustrated as an example. Alternatively, a gate switch circuit 110 may be disposed for transistor 101 only or for each of transistors 101 and 102.

The gate switch circuit 110 electrically connects the gate node Ngn or Ngp to the first node NP1 to reduce the potential difference applied between the gate and the drain of the transistors 101 or 102 at the time of the application of the ESD. In a modification of FIG. 19, the first node NP1 includes a power supply line PL1 (fourth embodiment), and the signal node Nio, or, a node coupled with the signal node Nio via a resistive element or a diode in a conducting state in the sixth embodiment.

On the other hand, the gate switch circuit 110 of FIG. 19, except during ESD application including at the time of the operation of the semiconductor device is controlled so as to electrically connect the gate node Ngn (Ngp) to the output node of the output buffer 21 (FIG. 1). Thus, during operation of the semiconductor device 10, in accordance with the output signal of the output buffer 21, it is possible to output one of the voltage of the H level and the voltage of the L level selectively to the I/O signal pad 205.

The output node of the output buffer 21 is not normally included in the path of the ESD current (discharge path 50). Therefore, by controlling the output destination of the gate node Ngn (Ngp) at the time of the application of the ESD by the gate switch circuit 110 at the time of the application of the ESD, it is possible to reduce the potential difference applied between the gate and the drain of the transistor 101 or 102. Thus, as to the transistors 101, 102 constituting the output circuit of the single-stage configuration, by the application of the electrostatic protection mechanism according to the present embodiment, it is possible to suppress the breakdown at the time of the application of the ESD.

With respect to the plurality of embodiments described above, it will also be described in a confirmatory manner that it is planned from the beginning of the application to appropriately combine the configurations described in the respective embodiments within a range in which inconsistencies and antilogies do not occur, including combinations not mentioned in the specification.

While the present disclosure has been specifically described based on the embodiments, it is needless to say that the present disclosure is not limited to the embodiments and can be variously modified without departing from the gist thereof.

What is claimed is:

1. A semiconductor device comprising:
a signal pad;
a GND pad;
a plurality of drive transistors electrically connected between a power supply line and a GND line via a signal node that is electrically connected to the signal pad; and
an electrostatic protection mechanism for forming a discharge path from the signal pad to the GND pad when an electrical signal is applied to the signal pad,
wherein the plurality of drive transistors include a transistor to be protected including a drain electrically connected to the signal pad,
wherein the electrostatic protection mechanism includes a gate switch circuit for controlling an electrical connection destination of a gate of the transistor to be protected at the time of the application of the electrical signal, and
wherein the gate switch circuit, at the time of the application of the electrical signal, electrically connects the gate to a first node at a potential that is higher than a potential of the GND line at the time of the formation of the discharge path.

2. The semiconductor device according to claim 1,
wherein a first power supply voltage higher than an operating voltage of each of the drive transistors is supplied to the power supply line,
wherein the semiconductor device further comprising a voltage dividing circuit resistively dividing the first power supply voltage, and outputting a second power supply voltage equivalent to the operating voltage to the reference voltage line, and
wherein the first node includes the reference voltage line.

3. The semiconductor device according to claim 1,
wherein the power supply line is supplied with a power supply voltage equivalent to the operating voltage of each of the drive transistors, and
wherein the first node includes the power supply line.

4. The semiconductor device according to claim 1,
wherein the first node includes the signal node, or, a node electrically connected to the signal node via a resistive element or a diode in a conducting state.

5. The semiconductor device according to claim 1,
wherein the electrostatic protection mechanism includes a switch control mechanism for outputting a predetermined voltage to the gate switch circuit in response to the formation of the discharge path, and
wherein the gate switch circuit is operated to electrically connect the gate of the transistor to be protected to the first node when the predetermined voltage is input.

6. The semiconductor device according to claim 5,
wherein the switch control mechanism includes:
a current sensing diode arranged to be conductive when a current is generated in the discharge path; and
a control transistor arranged to transmit the predetermined voltage to the gate switch circuit by being turned on in response to conduction of the current sensing diode.

7. The semiconductor device according to claim 6,
wherein the predetermined voltage is a ground voltage.

8. The semiconductor device according to claim 6,
wherein the predetermined voltage is a power supply voltage that is equal to or higher than an operating voltage of each of the drive transistors.

9. The semiconductor device according to claim 1,
wherein the plurality of drive transistors include a plurality of first transistors electrically connected in series between the power supply line and the signal node, and a plurality of second transistors electrically connected in series between the signal node and the GND line, and
wherein the gate switch circuit electrically connects the gate to a second node that supplies a gate voltage for turning on the transistor to be protected when the semiconductor device is operated.

10. The semiconductor device according to claim 9,
wherein the gate switch circuit is arranged corresponding to each of a first transistor to be protected including a drain electrically connected to the signal pad among the plurality of first transistors, and a second transistor to be protected including a drain electrically connected to the signal pad among the plurality of second transistors.

11. The semiconductor device according to claim 9 further comprising a plurality of input-output circuits,
wherein each of the plurality of input/output circuits includes a set of the plurality of drive transistors and the signal pad,
the gate switch circuit is shared among N pieces of the plurality of input/output circuits, N being an integer larger than or equal to two, and
wherein, in the N pieces of input/output circuits, the gates of the N pieces of transistors to be protected sharing the gate switch circuit are electrically connected to each other.

12. The semiconductor device according to claim 11 further comprising a switch control mechanism for outputting a predetermined voltage to the gate switch circuit in response to the formation of the discharge path,
wherein the gate switch circuit is operated to electrically connect the gate of the transistor to be protected to the first node when the predetermined voltage is input, and
wherein the gate switch circuit and the switch control mechanism are shared among the N pieces of input/output circuits.

13. The semiconductor device according to claim 1,
wherein the plurality of drive transistors include a first transistor electrically connected between the power supply line and the signal node, and a second transistor electrically connected between the signal node and the GND line,
wherein the semiconductor device further comprises an output buffer for generating an output signal from the signal pad at the time of the operation of the semiconductor device, and
wherein the gate switch circuit electrically connects an output node of the output buffer to the gate during operation of the semiconductor device.

14. The semiconductor device according to claim 13,
wherein the gate switch circuit is arranged corresponding to each of the first and second transistors.

15. The semiconductor device according to claim 1,
wherein the electrical signal is electrical disturbance noise.

16. The semiconductor device according to claim 15,
wherein the electrical disturbance noise is an electrostatic discharge, and
wherein the electrostatic discharge includes a test electrical signal simulating the electrostatic discharge.

17. The semiconductor device according to claim 1,
wherein the discharge path includes the power supply line and the GND line.

* * * * *